United States Patent
Tomioka et al.

(10) Patent No.: US 9,770,753 B2
(45) Date of Patent: Sep. 26, 2017

(54) SURFACE ROUGHENING APPARATUS FOR METAL STOCK AND SURFACE ROUGHENING METHOD FOR METAL STOCK

(71) Applicant: TOYOTA JIDOSHA KABUSHIKI KAISHA, Toyota-shi, Aichi-ken (JP)

(72) Inventors: Akinori Tomioka, Nagoya (JP); Hirofumi Inoshita, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/163,257

(22) Filed: May 24, 2016

(65) Prior Publication Data

US 2017/0014885 A1   Jan. 19, 2017

(30) Foreign Application Priority Data

Jul. 13, 2015 (JP) .................................. 2015-139445

(51) Int. Cl.
| | |
|---|---|
| *B21K 23/00* | (2006.01) |
| *B21J 13/02* | (2006.01) |
| *B21D 17/02* | (2006.01) |
| *B23P 9/00* | (2006.01) |

(52) U.S. Cl.
CPC ............. *B21K 23/00* (2013.01); *B21D 17/02* (2013.01); *B21J 13/02* (2013.01); *B23P 9/00* (2013.01)

(58) Field of Classification Search
CPC ........ B21D 17/00; B21D 17/02; B21D 22/10; B21D 22/02; B21D 22/04; B21D 24/005; B21D 28/24; B21D 28/26; B21D 28/265; B21D 31/02; B21D 31/06; B21D 31/005; B21K 23/00; B23P 9/00
USPC .................................. 72/413, 414, 469, 470
See application file for complete search history.

(56) References Cited

U.S. PATENT DOCUMENTS

| | | | |
|---|---|---|---|
| 6,502,447 B2* | 1/2003 | Adams ................... | B21D 13/02 72/326 |
| 8,567,226 B2* | 10/2013 | Morales ................ | B21D 22/02 72/41 |
| 8,997,543 B2* | 4/2015 | Therrien ................ | B21D 37/10 175/423 |
| 2010/0326270 A1 | 12/2010 | Doerfler et al. | |

FOREIGN PATENT DOCUMENTS

| | | | | |
|---|---|---|---|---|
| JP | 58038631 A | * | 3/1983 | .............. B21J 13/02 |
| JP | S60-248337 A | | 12/1985 | |
| JP | H04-127928 A | | 4/1992 | |
| JP | 2011-005549 A | | 1/2011 | |

* cited by examiner

*Primary Examiner* — Teresa M Ekiert
(74) *Attorney, Agent, or Firm* — Oliff PLC

(57) ABSTRACT

A surface roughening apparatus includes a first mold and a second mold. The first mold has a plurality of first protrusions. The first mold presses a metallic material to form recesses corresponding to respective shapes of the first protrusions in a surface of the metallic material. The second mold has a plurality of second protrusions. After the first mold presses the metallic material, the second mold presses the metallic material, thereby deforming each recess into an undercut shape. A height of each first protrusion is greater than a height of each second protrusion. A tip angle of each first protrusion is smaller than a tip angle of each second protrusion.

8 Claims, 20 Drawing Sheets

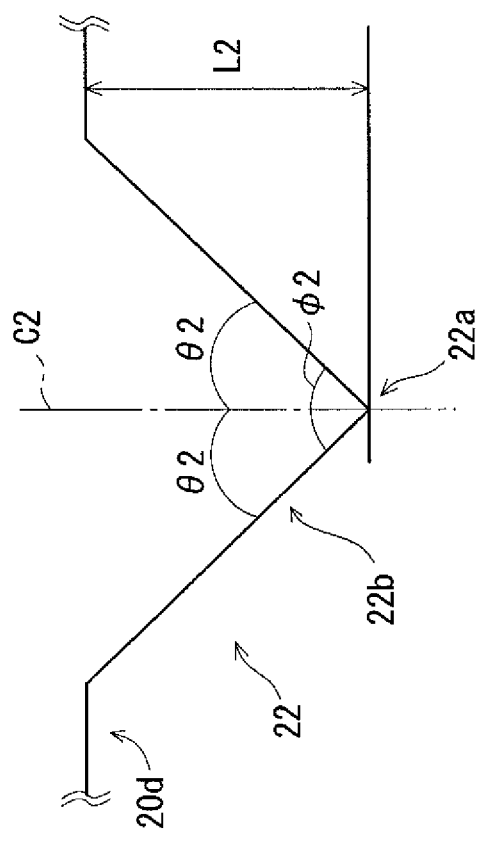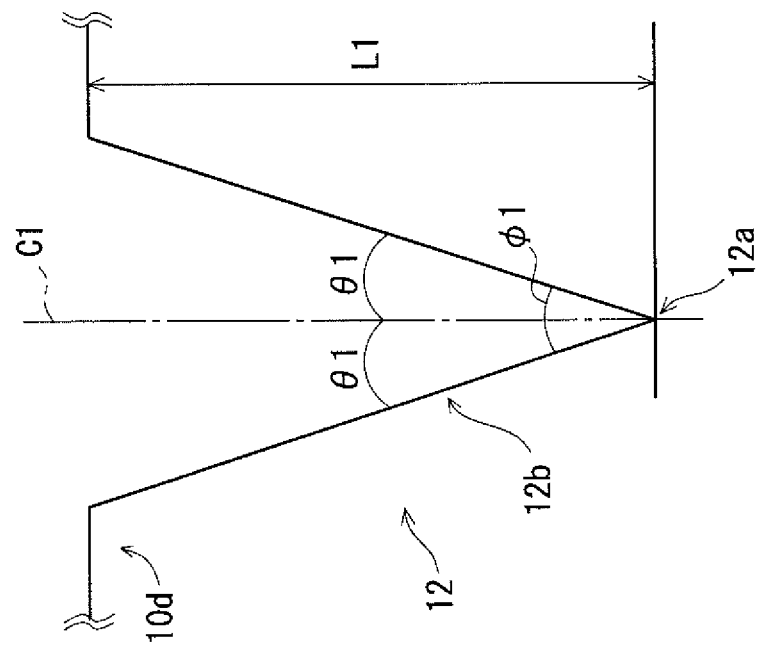
Fig. 6

Fig. 11
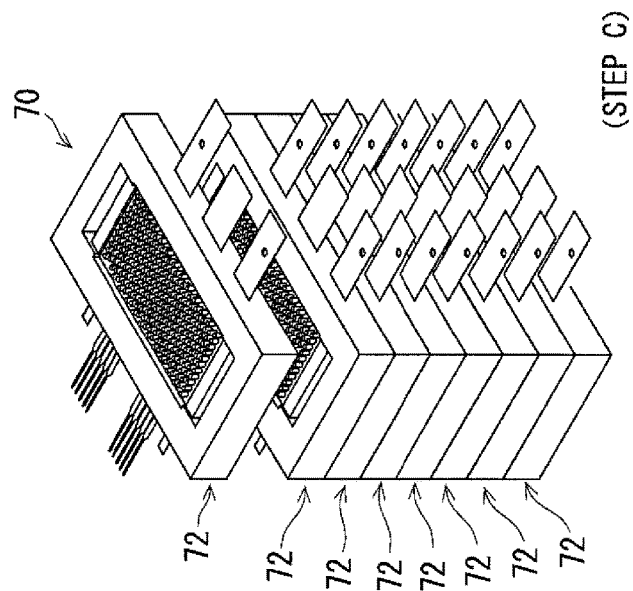
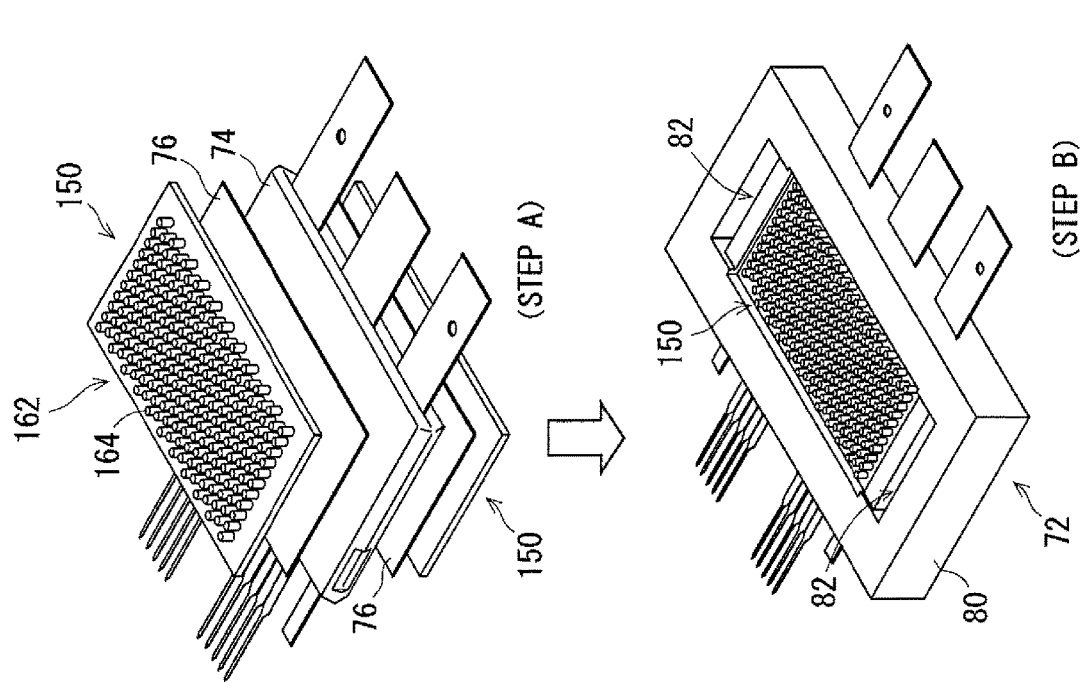

Fig. 19
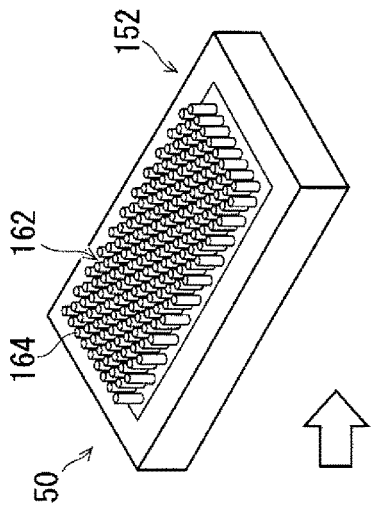
S102 (FORMATION OF PIN FINS)
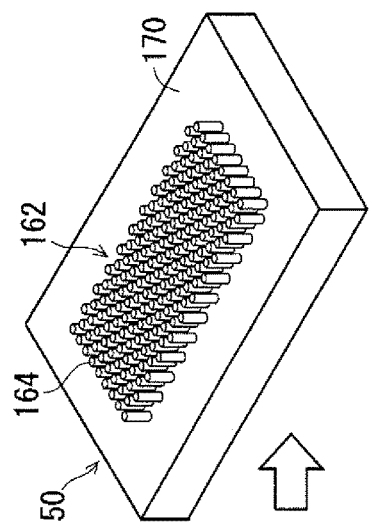
S104 (TRIMMING)
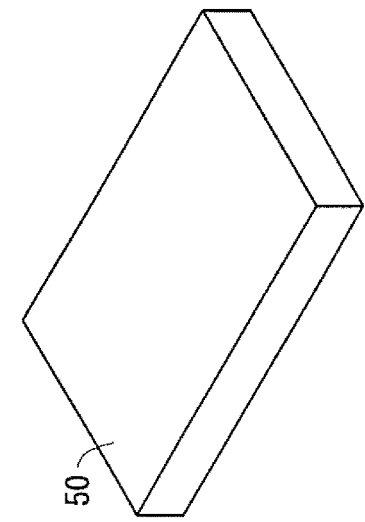
S106 (S12: FIRST STEP)
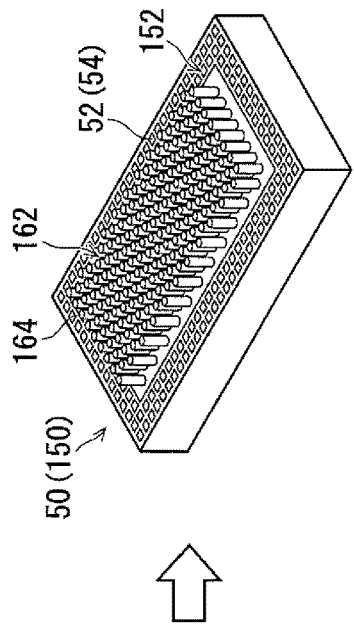
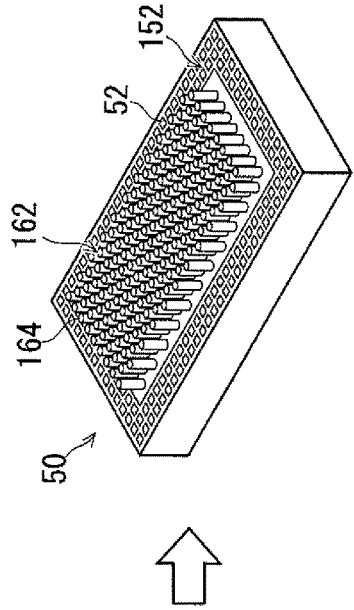
S108 (S16: SECOND STEP)

SURFACE ROUGHENING APPARATUS FOR METAL STOCK AND SURFACE ROUGHENING METHOD FOR METAL STOCK

INCORPORATION BY REFERENCE

This application is based upon and claims the benefit of priority from Japanese patent application No. 2015-139445, filed on Jul. 13, 2015, the disclosure of which is incorporated herein in its entirety by reference.

BACKGROUND

1. Technical Field

The present disclosure relates to a surface roughening apparatus for a metal stock and a surface roughening method for a metal stock, and more particularly, to a surface roughening apparatus and a surface roughening method for roughening a surface of a metal stock.

2. Description of Related Art

It is known that in the case of bonding a metallic material and a resin to each other, the surface of the metallic material is roughened to increase the surface area, which leads to an improvement in bonding strength. Examples of the roughening method include methods using a laser, etching, and shot blasting. However, in the method using a laser, an increase in processing time and an increase in equipment cost cause an increase in manufacturing cost. In the method using etching and the method using shot blasting, convex and concave portions formed on the surface of the metallic material have a small depth, which may make it difficult to obtain a sufficient bonding strength.

It is also known that in the case of roughening a surface of a metallic material, a recess (concave portion) formed on the surface of the metallic material is formed in an "undercut shape", which leads to a further improvement in the bonding strength. The "undercut shape" refers to a shape in which a middle part of a wall surface forming a recess projects (outstands) inwardly (toward the hole of the recess, i.e., toward the center of the recess). In the case of bonding the metallic material and a resin to each other, the resin is made to flow into the recess. Thus, even if a force acts in a direction in which the resin is separated from the metallic material, the resin hooks at the undercut shape, which prevents the resin from being separated from the metallic material. This leads to a further improvement in the bonding strength.

In connection with the technique described above, Japanese Unexamined Patent Application Publication No. 2011-005549 discloses a method of roughening metal surfaces to improve the adhesion of layers thermally sprayed thereon. In the method disclosed in Japanese Unexamined Patent Application Publication No. 2011-005549, ridges which are formed between grooves formed in the metal surface are plastically deformed to form undercuts in the grooves.

SUMMARY

In the method disclosed in Japanese Unexamined Patent Application Publication No. 2011-005549, the grooves are formed by a drilling process or the like in the metal surface, and then the ridges are plastically deformed continuously by the rotation of a roller. In such a structure, each ridge is plastically deformed by the roller at only one location, which results in an increase in the processing time for forming undercuts in all the grooves.

The disclosure provides a surface roughening apparatus and a surface roughening method which are capable of roughening a surface of a metal stock more efficiently so as to increase a bonding strength.

A first exemplary aspect relates to a surface roughening apparatus that roughens a surface of a metal stock, the surface roughening apparatus including: a first mold having a plurality of first protrusions, a surface of the first mold having the plurality of first protrusions formed thereon being configured to press the metal stock in a state where the surface of the first mold faces a first surface of the metal stock, thereby forming recesses in the metal stock each having a shape corresponding to a shape of each of the first protrusions; and a second mold having a plurality of second protrusions, a surface of the second mold having the plurality of second protrusions formed thereon being configured to face the first surface of the metal stock after the formation of the recesses in the metal stock by the first mold, the plurality of second protrusions being configured to press the metal stock in a state where the plurality of second protrusions are respectively pressed into the recesses, thereby deforming the recesses formed in the metal stock into an undercut shape. A height of each of the first protrusions is greater than a height of each of the second protrusions. A tip angle of each of the first protrusions is smaller than a tip angle of each of the second protrusions.

A second exemplary aspect relates to a surface roughening method that roughens a surface of a metal stock, the surface roughening method including: a first step of using a first mold having a plurality of first protrusions to form recesses in the metal stock, each having a shape corresponding to a shape of each of the first protrusions, by pressing a surface of the first mold having the plurality of first protrusions formed thereon against the metal stock in a state where the surface of the first mold faces a first surface of the metal stock; and a second step of using a second mold having a plurality of second protrusions to deform the recesses formed in the metal stock into an undercut shape by pressing a surface of the second mold having the plurality of second protrusions formed thereon and facing the first surface of the metal stock against the first surface of the metal stock after the first step so that the metal stock is pressed in a state in which the plurality of second protrusions are respectively pressed into the recesses, the plurality of second protrusions having a height lower than a height of each of the first protrusions, and having a tip angle larger than a tip angle of each of the first protrusions.

When the height of each of the first protrusions is greater than the height of each of the second protrusions and when the tip angle of each of the first protrusions is smaller than the tip angle of each of the second protrusions, each of the recesses can be formed into an undercut shape after the metal stock is plastically deformed by pressing using the second mold. With the method in which the metal stock is pressed (press work) using the first mold having the plurality of first protrusions formed thereon and the metal stock is pressed (press work) using the second mold having the plurality of second protrusions formed thereon, a plurality of portions can be formed into an undercut shape all at once by the two pressing steps, and thus the work can be completed in a short period of time. Therefore, it is possible to roughen the surface of the metal stock more efficiently so as to increase the bonding strength.

Preferably, when the second mold presses the metal stock, each of the plurality of second protrusions faces a location where a corresponding one of the plurality of first protrusions has come into contact with the metal stock.

With this structure, approximately uniform undercut shapes are formed in the respective recesses. The formation of approximately uniform undercut shapes makes it possible to improve the bonding strength. Undercut shapes for further improving the bonding strength thus can be formed more reliably.

Preferably, an area of the first mold in which the plurality of first protrusions are not formed is formed on the surface of the first mold having the plurality of first protrusions formed thereon, and an area of the second mold in which the plurality of second protrusions are not formed is formed on the surface of the second mold having the plurality of second protrusions formed thereon.

With this structure, when there is no need to roughen the entire surface of some metal stock, only the area (for example, the periphery of the surface of the metal stock) that needs to be roughened can be roughened, without roughening the area (for example, a central portion of the surface of the metal stock) for which there is no need to roughen the metal stock.

According to the disclosed embodiments, it is possible to provide a surface roughening apparatus and a surface roughening method which are capable of roughening a surface of a metal stock more efficiently so as to increase a bonding strength.

The above and other objects, features and advantages of the embodiments will become more fully understood from the detailed description given hereinbelow and the accompanying drawings which are given by way of illustration only, and thus are not to be considered as limiting.

BRIEF DESCRIPTION OF THE DRAWINGS

FIG. 6 is a diagram for comparing a protrusion (convex portion) formed on the first mold with a protrusion (convex portion) formed on the second mold;

FIG. 11 is a diagram showing a method for producing an electronic device according to a second exemplary embodiment;

FIG. 19 is a process chart showing an example in which formation of pin fins and trimming are carried out in a step different from a roughening step.

Figure 1:
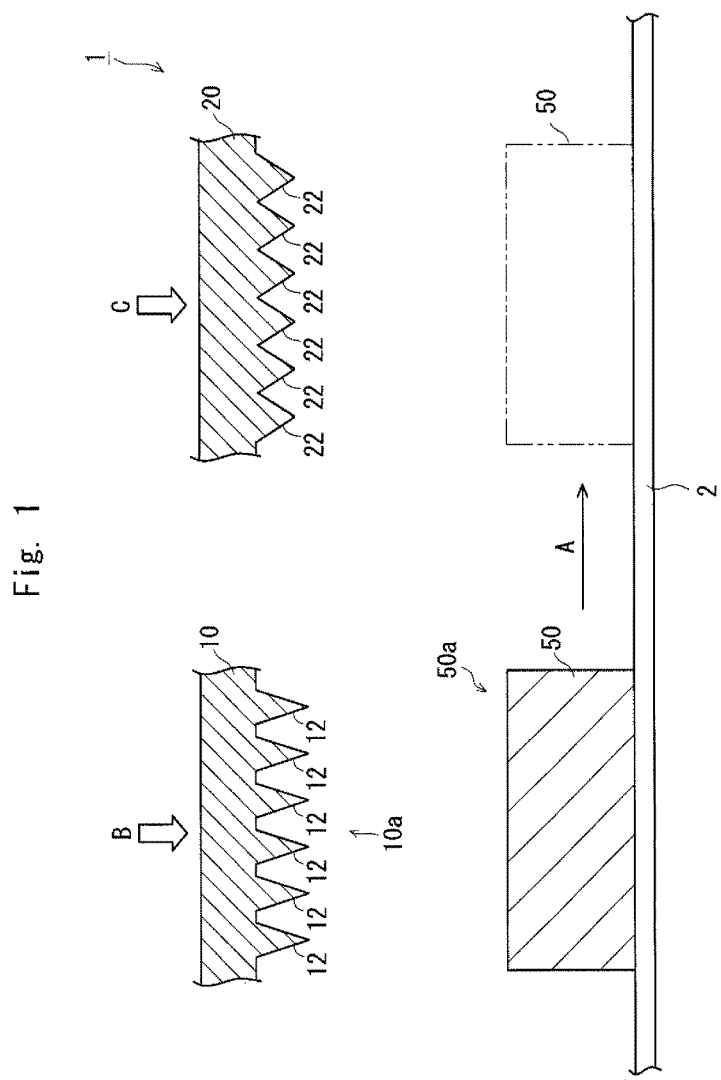
FIG. 1 is a diagram showing a surface roughening apparatus according to a first exemplary embodiment.

DESCRIPTION OF THE EXEMPLARY EMBODIMENTS (First Exemplary Embodiment)

Exemplary embodiments will be described below with reference to the drawings. The same elements are denoted by the same reference numerals throughout the drawings, and repeated descriptions thereof are omitted as appropriate.

FIG. 1 is a diagram showing a surface roughening apparatus 1 according to a first exemplary embodiment. The surface roughening apparatus 1 includes a transport member 2, which transports a metallic material 50 (metal stock), a first mold 10 (first mold), and a second mold 20 (second mold). The transport member 2 transports the metallic material 50 to a location facing the first mold 10. As a result, an opposed surface 10a of the first mold 10 faces a surface 50a (first surface) of the metallic material 50. As indicated by an arrow A, the transport member 2 transports the metallic material 50 to a location facing the second mold 20. As a result, an opposed surface 20a of the second mold 20 faces the surface 50a of the metallic material 50.

The first mold 10 and the second mold 20 are each formed of a material harder than the metallic material 50. The metallic material 50 is formed of, for example, aluminum, copper, or the like. On the other hand, the first mold 10 and the second mold 20 are each formed of, for example, an alloy tool steel (SKD), which is generally used for a mold.

The first mold 10 has a plurality of protrusions 12 (first protrusions). The protrusions 12 are formed on the opposed surface 10a of the first mold 10. As shown in FIG. 1, the protrusions 12 are each formed in an angular shape (a conical shape, a polygonal pyramid shape, etc.). Each protrusion 12 is narrowed toward its tip and has a pointed tip. As indicated by an arrow B, the first mold 10 presses the metallic material 50 (press work), This allows the first mold 10 to transfer the shapes of the protrusions 12 to the surface 50a of the metallic material 50. This will be described in detail later.

The second mold 20 has a plurality of protrusions 22 (second protrusions). The protrusions 22 are formed on the opposed surface 20a of the second mold 20. As shown in FIG. 1, the protrusions 22 are each formed in an angular shape (a conical shape, a polygonal pyramid shape, etc.). Each protrusion 22 is narrowed toward its tip and has a pointed tip. After the first mold 10 presses the metallic material 50, the second mold 20 presses the metallic material 50 (press work) as indicated by an arrow C. This allows the second mold 20 to transfer the shapes of the protrusions 22 to the surface 50a (recesses 52) of the metallic material 50. This will be described in detail later.

In this case, the length of each protrusion 12 in a direction toward the metallic material 50 is longer than the length of each protrusion 22 in a direction toward the metallic material 50. In other words, the height of each protrusion 12 is greater than the height of each protrusion 22. The angle at the tip of each protrusion 12 is smaller than the angle at the tip of each protrusion 22. In other words, the slope (gradient) of a side surface of each protrusion 12 in a direction toward the metallic material 50 is smaller than the slope (gradient) of a side surface of each protrusion 22 in a direction toward the metallic material 50.

Figure 2:
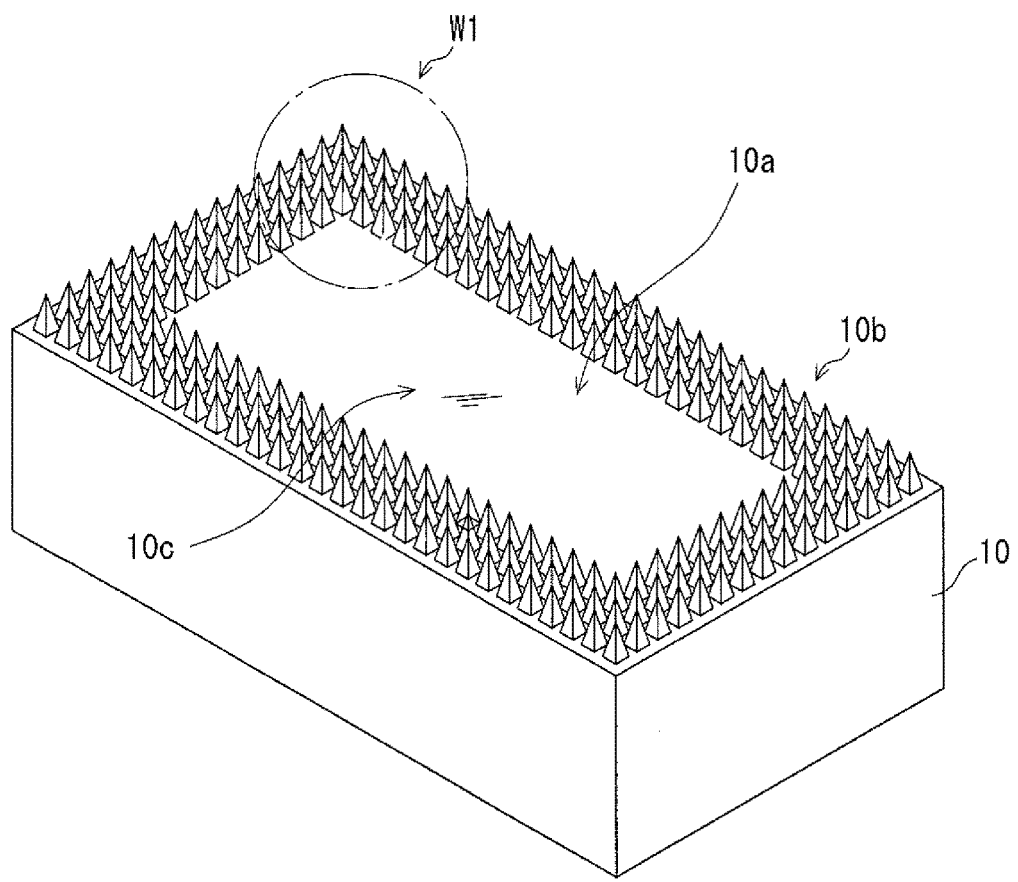
FIG. 2 is a perspective view showing a first mold according to the first exemplary embodiment.
Figure 3:
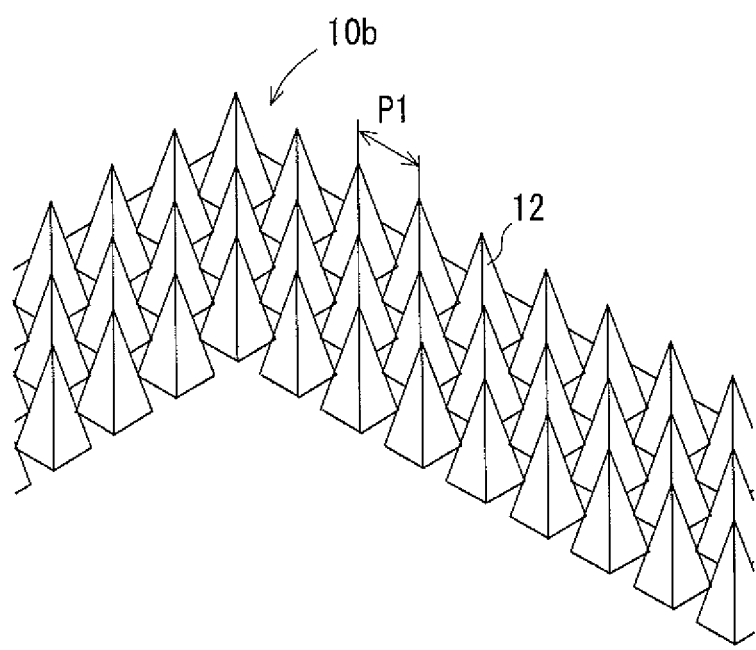
FIG. 3 is a partially enlarged view of the first mold.

FIG. 2 is a perspective view showing the first mold 10 according to the first exemplary embodiment. FIG. 3 is a partially enlarged view of the first mold 10. FIG. 3 is an enlarged view of an encircled portion (as indicated by an arrow W1) in FIG. 2. A roughening molding portion 10b for roughening the surface 50a of the metallic material 50 and a non-roughening portion 10e (first non-roughening portion) that is an area in which roughening is not performed are formed on the opposed surface 10a of the first mold 10. That is, the protrusions 12 are formed on the roughening molding portion 10b and the protrusions 12 are not formed on the non-roughening portion 10c. For example, in some products, the roughening molding portion 10b is provided around (encircles) the non-roughening portion 10c. In the first exemplary embodiment, the non-roughening portion 10c may be a simple flat surface. As described later, the non-roughening portion 10c can be appropriately formed depending on the product formed of the metallic material 50. In some products, there is no need to roughen the entire surface thereof. In such a case, the formation of the non-roughening portion 10c enables roughening of only the area (for example, the periphery of the surface 50a of the metallic material 50) that needs to be roughened, without roughening the area (for example, a central portion of the surface 50a of the metallic material 50) for which there is no need to roughen the metallic material 50.

A plurality of (a number of) protrusions 12 are formed on the roughening molding portion 10b. FIG. 3 shows an example in which each protrusion 12 has a substantially square pyramid shape. However, the shape of each protrusion 12 is not limited to the square pyramid shape, and instead may be a polygonal pyramid shape (for example, a triangular pyramid shape), or a conical shape (tapered shape). As shown in FIG. 3, the plurality of protrusions 12 are arranged in a plurality of rows in the roughening molding portion 10b. Preferably, the plurality of protrusions 12 are arranged at substantially regular intervals with a pitch P1 between the adjacent protrusions 12.

Figure 4:
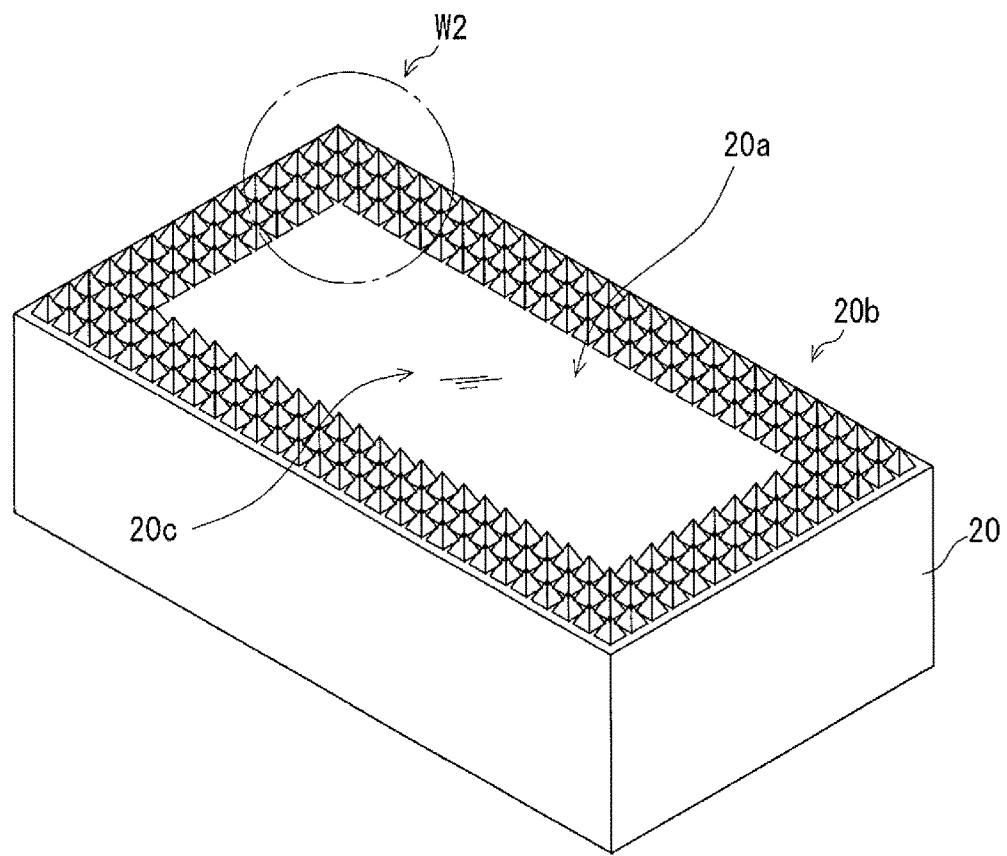
FIG. 4 is a perspective view showing a second mold according to the first exemplary embodiment.
Figure 5:
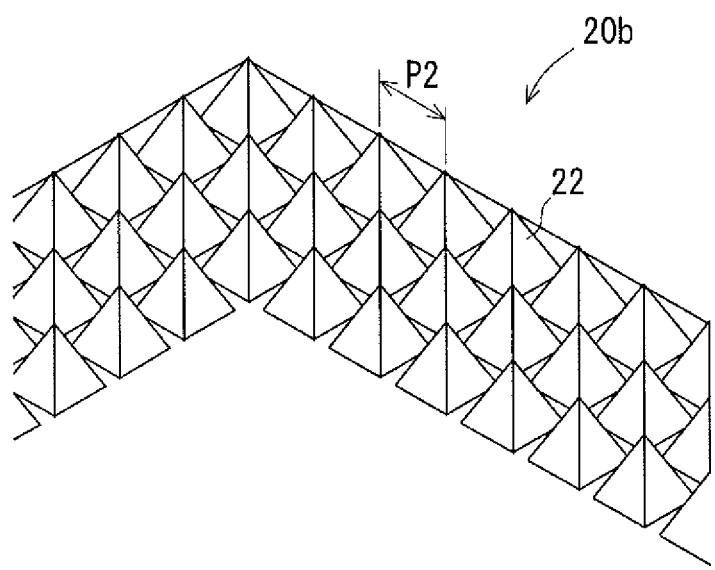
FIG. 5 is a partially enlarged view of the second mold.

FIG. 4 is a perspective view showing the second mold 20 according to the first exemplary embodiment. FIG. 5 is a partially enlarged view of the second mold 20. FIG. 5 is an enlarged view showing an encircled portion (as indicated by an arrow W2) in FIG. 4. A roughening molding portion 20b for roughening the surface 50a of the metallic material 50 and a non-roughening portion 20c (second non-roughening portion) that is an area in which roughening is not performed are formed on the opposed surface 20a of the second mold 20. That is, the protrusions 22 are formed in the roughening molding portion 20b and the protrusions 22 are not formed in the non-roughening portion 20c. For example, in some products, the roughening molding portion 20b is provided around (encircles) the non-roughening portion 20c. In the first exemplary embodiment, the non-roughening portion 20c may be a simple flat surface. As described later, the non-roughening portion 20c can be appropriately formed depending on the product formed of the metallic material 50. In some products, there is no need to roughen the entire surface thereof. In such a case, the formation of the non-roughening portion 20c enables roughening of only the area (for example, the periphery of the surface 50a of the metallic material 50) that needs to be roughened, without roughening the area (for example, a central portion of the surface 50a of the metallic material 50) for which there is no need to roughen the metallic material 50.

A plurality of (a number of) protrusions 22 are formed on the roughening molding portion 20b. FIG. 5 shows an example in which each protrusion 22 has a substantially square pyramid shape. However, as with the protrusions 12, the shape of each protrusion 22 is not limited to the square pyramid shape, and instead may be a polygonal pyramid shape (for example, a triangular pyramid shape), or a conical shape (tapered shape). In this case, the shape of each protrusion 22 preferably corresponds to the shape of each protrusion 12. Specifically, when each of the protrusions 12 is formed in a substantially square pyramid shape, each of the protrusions 22 is also formed in a substantially square pyramid shape. When each of the protrusions 12 is formed in a substantially conical shape, each of the protrusions 22 is also formed in a substantially conical shape. As shown in FIG. 5, the plurality of protrusions 22 are arranged in a plurality of rows in the roughening molding portion 20b. Preferably, the plurality of protrusions 22 are arranged at substantially regular intervals with a pitch P2 between the adjacent protrusions 22.

In this case, the pitch P1 of the protrusions 12 is preferably substantially the same as the pitch P2 of the protrusions 22. For example, each of the pitch P1 and the pitch P2 is about 0.04 mm. This allows each of the protrusions 22 to come into contact with a location where a corresponding one of the protrusions 12 comes into contact with the surface 50a of the metallic material 50 when the metallic material 50 is pressed by the first mold 10.

FIG. 6 is a diagram for comparing each protrusion 12 formed on the first mold 10 with each protrusion 22 formed on the second mold 20. FIG. 6 shows cross-sections of the protrusion 12 and the protrusion 22. A length from a forming surface 10d on which the protrusion 12 of the first mold 10 is formed to a tip 12a of the protrusion 12 is represented by L1. A length from a forming surface 20d on which the protrusion 22 of the second mold 20 is formed to a tip 22a of the protrusion 22 is represented by L2. That is, the length L1 represents the length of the protrusion 12 in the direction toward the metallic material 50, and the length L2 represents the length of the protrusion 22 in the direction toward the metallic material 50. In other words, the length L1 represents the height of the protrusion 12, and the length L2 represents the height of the protrusion 22. In this case, the length L1 of the protrusion 12 is longer than the length L2 of the protrusion 22. That is, the height (L1) of the protrusion 12 is greater than the height (L2) of the protrusion 22. To put it the other way around, the length L2 of the protrusion 22 is shorter than the length L1 of the protrusion 12. In other words, the height (L2) of the protrusion 22 is lower than the height (L1) of the protrusion 12. That is, L1>L2 holds. For example, L1 is about 0.1 mm and L2 is ½ to ⅓ of L1. However, the lengths L1 and L2 are not limited to these lengths.

Assuming that a virtual center line (as indicated by a dashed-dotted line) of the protrusion 12 is represented by C1, the virtual center line C1 extends along the direction from the tip 12a of the protrusion 12 to the metallic material 50. An angle formed between a side surface 12b of the protrusion 12 and the virtual center line C1 is represented by θ1. In this case, the angle θ1 corresponds to the slope of the side surface 12b with respect to the virtual center line C1, and $\phi1$ (=2*$\theta1$) corresponds to the tip angle of the protrusion 12. Similarly, assuming that a virtual center line (as indicated by a dashed-dotted line) of the protrusion 22 is represented by C2, the virtual center line C2 extends along the direction from the tip 22a of the protrusion 22 to the metallic material 50. An angle formed between a side surface 22b of the protrusion 22 and the virtual center line C2 is represented by $\theta2$. In this case, the angle $\theta2$ corresponds to the slope of the side surface 22b with respect to the virtual center line C2, and $\phi2$ (=2*$\theta2$) corresponds to the tip angle of the protrusion 22.

In this case, the slope $\theta1$ of the side surface 12b with respect to the virtual center line C1 of the protrusion 12 is smaller than the slope $\theta2$ of the side surface 22b with respect to the virtual center line C2 of the protrusion 22. In other words, the tip angle $\phi1$ of the protrusion 12 is smaller than the tip angle $\phi2$ of the protrusion 22. To put it the other way around, the tip angle $\phi2$ of the protrusion 22 is larger than the tip angle $\phi1$ of the protrusion 12. That is, $\theta1<\theta2$ and $\phi1<\phi2$ hold. For example, $\phi1$ is 20 to 30 degrees and $\phi2$ is 40 to 50 degrees. However, the tip angles $\phi1$ and $\phi2$ are not limited to these angles.

Next, an operation of the surface roughening apparatus 1 according to the first exemplary embodiment will be described.

Figure 7:
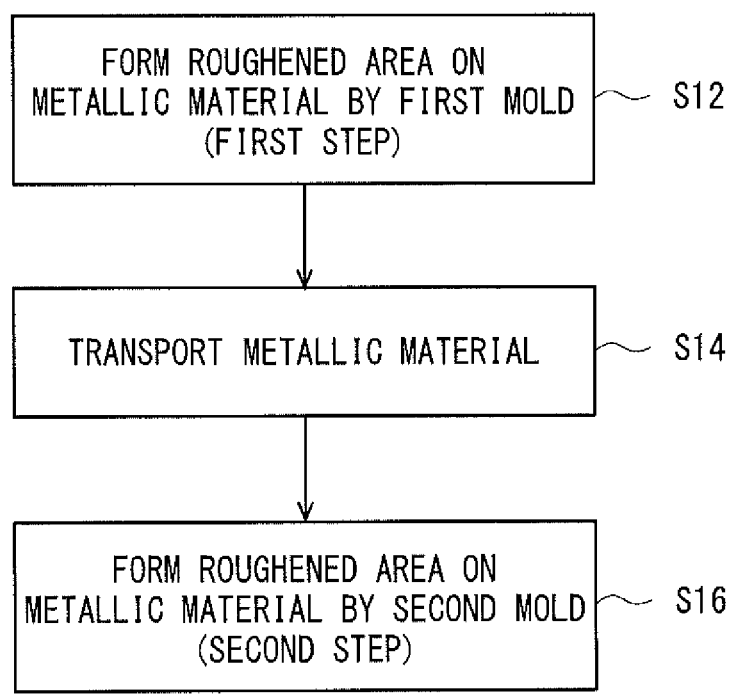
FIG. 7 is a flowchart showing a surface roughening method by the surface roughening apparatus according to the first exemplary embodiment.

FIG. 7 is a flowchart showing a surface roughening method using the surface roughening apparatus 1 according to the first exemplary embodiment. First, the surface roughening apparatus 1 forms a roughened area in the metallic material 50 by using the first mold 10 (step S12). The step using the first mold 10 is referred to as the "first step". The first step will be described later. In the first step, recesses are formed on the surface 50a of the metallic material 50.

Next, the surface roughening apparatus 1 transports the metallic material 50 by using the transport member 2 (step S14). This allows the metallic material 50 to move toward the location facing the second mold 20. Next, the surface roughening apparatus 1 forms a roughened area in the metallic material 50 by using the second mold 20 (step S16). The step using the second mold 20 is referred to as the "second step". The second step will be described later. In the second step, the recesses formed in the metallic material 50 are deformed, and an undercut shape is imparted (added) to each of the recesses.

Figure 8:
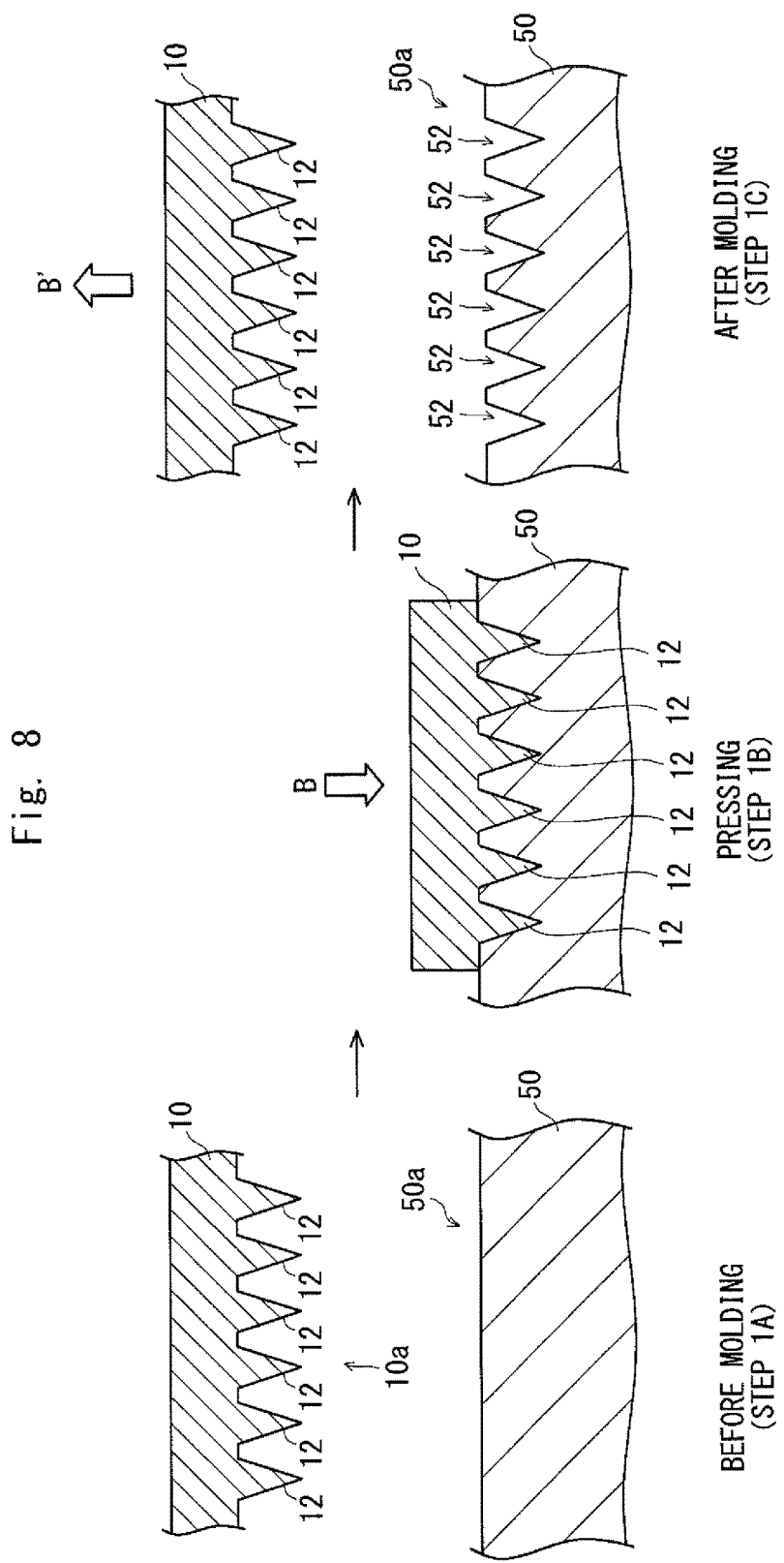
FIG. 8 is a process chart showing details of a first step in the surface roughening method according to the first exemplary embodiment.

FIG. 8 is a process chart showing details of the first step in the surface roughening method according to the first exemplary embodiment. In step 1A, the opposed surface 10a on which the protrusions 12 of the first mold 10 are formed faces the surface 50a of the metallic material 50. In step 1B, the first mold 10 is moved toward the metallic material 50 as indicated by the arrow B. This allows the first mold 10 to press the metallic material 50. At this time, the plurality of protrusions 12 formed on the first mold 10 are pressed into the surface 50a of the metallic material 50, so that the metallic material 50 is plastically deformed. In step 1C, the first mold 10 is moved in a direction away from the metallic material 50 as indicated by an arrow B'.

In this manner, the first mold 10 forms the plurality of recesses 52 on the surface 50a of the metallic material 50. The shape of each of the plurality of recesses 52 corresponds to the shape of each of the plurality of protrusions 12. Specifically, the depth of each recess 52 corresponds to the length L1 of each protrusion 12. The slope of the side surface of each recess 52 corresponds to the slope of the side surface of each protrusion 12.

Figure 9:
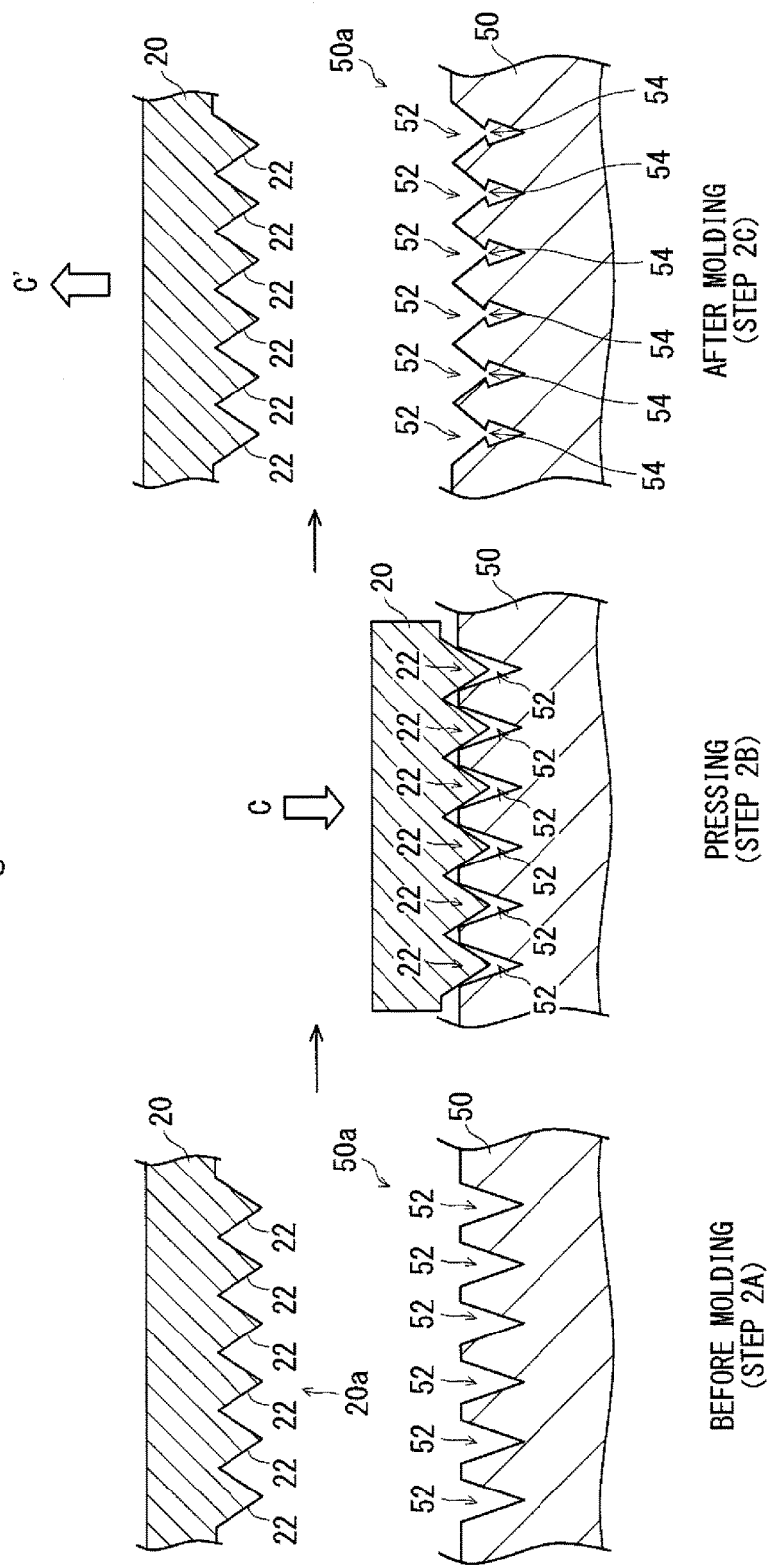
FIG. 9 is a process chart showing details of a second step in the surface roughening method according to the first exemplary embodiment.

FIG. 9 is a process chart showing details of the second step in the surface roughening method according to the first exemplary embodiment. In step 2A, the opposed surface 20a on which the protrusions 22 of the second mold 20 are formed faces the surface 50a of the metallic material 50. At this time, the recesses 52 are formed on the surface 50a of the metallic material 50. In step 2B, the second mold 20 is moved toward the metallic material 50 as indicated by the arrow C, This allows the second mold 20 to press the metallic material 50. At this time, the plurality of protrusions 22 formed on the second mold 20 are respectively pressed into the plurality of recesses 52, so that the metallic material is plastically deformed. In step 2C, the second mold 20 is moved in a direction away from the metallic material 50 as indicated by an arrow C'.

In this manner, the shape of each recess 52 is changed by the corresponding protrusion 22 of the second mold 20, Thus, an undercut shape 54 is formed in (imparted to) each recess 52. In this case, each protrusion 22 is preferably opposed to a location where the protrusion 12 has come into contact with the surface 50a of the metallic material 50 (that is, the center of each recess 52). The formation of the undercut shape 54 will be described below. In particular, after the transfer of the shapes of the protrusions 12 by the first mold 10, each protrusion 22 of the second mold 20 needs to be brought into contact with the location of the corresponding recess 52. Accordingly, it is necessary to determine in advance the relative positions of the first mold 10 and the metallic material 50 as a workpiece and the relative positions of the second mold 20 and the workpiece. It is preferable to employ a positioning mechanism appropriate for this purpose.

Figure 10:
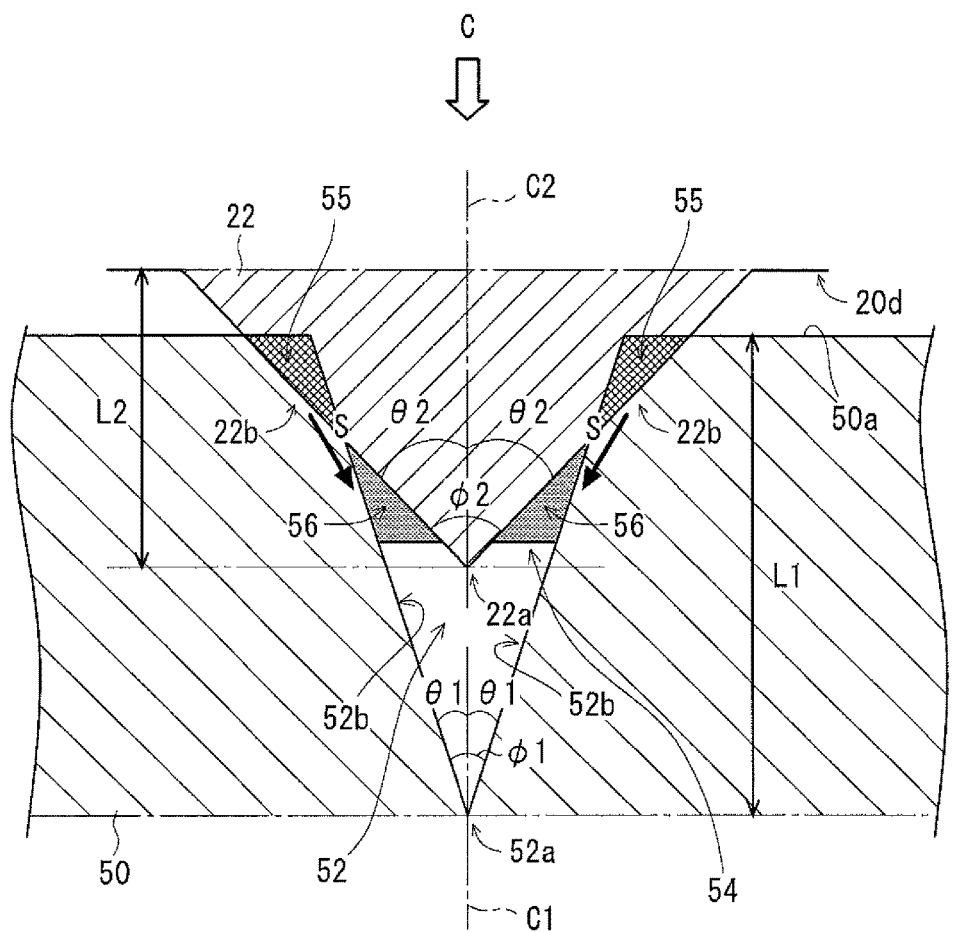
FIG. 10 is a diagram showing a mechanism in which an undercut shape is formed in a recess according to the first exemplary embodiment.

FIG. 10 is a diagram showing a mechanism in which the undercut shape 54 is formed in each recess 52 according to the first exemplary embodiment. FIG. 10 corresponds to a sectional view showing the vicinity of the recess 52 in the state of step 2B shown in FIG. 9. First, in step 1C shown in FIG. 8 (step 2A shown in FIG. 9), the recess 52 is formed in the metallic material 50 (surface 50a). This recess 52 is formed of a bottom portion 52a and a side surface 52b. The bottom portion 52a corresponds to the tip 12a of the corresponding protrusion 12, and the side surface 52b corresponds to the side surface 12b. That is, the depth of the recess 52 is substantially equal to the length L1 of the protrusion 12. Further, the slope of the side surface 52b of the recess 52 with respect to the virtual center line C1 is substantially equal to the slope $\theta1$ of the side surface 12b of the protrusion 12. Hereinafter, the depth of the recess 52 is represented by L1 and the slope of the side surface 52b is represented by $\theta1$.

The slope $\theta2$ of the side surface 22b of the protrusion 22 (the tip angle $\phi2$ of the protrusion 22) is greater than the slope $\theta1$ of the side surface 52b of the recess 52 (the angle ($\phi1$ of the bottom portion 52a). Accordingly, when the tip 22a of the protrusion 22 enters into the recess 52 as indicated by the arrow C, the side surface 22b of the protrusion 22 comes into contact with corner portions 55 which correspond to a boundary between the recess 52 and the surface 50a. When the protrusion 22 further enters into the recess 52 as indicated by the arrow C in this state, the material of the corner portions 55 is crushed and deformed in such a manner that the corner portions 55 project toward the inside of the recess 52 as indicated by arrows S.

Further, since the length L2 of the protrusion 22 is smaller than the depth L1 of the recess 52, the tip 22a of the protrusion 22 is stopped in the middle of the recess 52 even when the protrusion 22 enters into the recess 52 until the forming surface 20d of the protrusion 22 comes into contact with the surface 50a. Depending on the location of the protrusion 22 at this time, projecting portions 56 which project toward the center of the recess 52 from the side surface 52b are respectively formed in the middle of the side surfaces 52b of the recess 52. Thus, the undercut shape 54 is formed.

In this exemplary embodiment, the appropriate undercut shape 54 is formed by a relatively simple method such as mold pressing (punch press), unlike in the method of forming an undercut by excavating a groove and deforming a ridge. By employing the punch press method, the plurality of recesses 52 can be formed at once on the surface 50a of the metallic material 50 (first step) and the undercut shapes 54 can be formed at once in the respective recesses 52 (second step).

When a laser, shot blasting, or the like is used as a roughening method, large facilities are used, which leads to an increase in cost. Further, it takes a considerable time to form the recesses 52 each having the undercut shape 54. On the other hand, according to this exemplary embodiment, the above-described structure enables the use of relatively small facilities, such as molds for pressing, and thus the cost can be suppressed. Furthermore, as described above, the recesses 52 each having the undercut shape 54 can be formed in a short period of time.

That is, in this exemplary embodiment, the appropriate undercut shape 54 that improves the bonding strength between the metallic material 50 and a resin can be formed in a shorter period of time. Accordingly, in this exemplary embodiment, roughening of the surface of the metallic material to increase the bonding strength can be performed more efficiently.

Since the depth (the depth of each recess 52) required for processing the surface 50a of the metallic material 50 is about 0.1 mm, which is not very deep, there is no need to increase the pressure load for forming each recess 52. Thus, the abrasion of the molds can be minimized, Preferably, the pitch PI of the protrusions 12 of the first mold 10 is substantially the same as the pitch P2 of the protrusions 22 of the second mold 20. The locations of the protrusions 22 of the second mold 20 respectively correspond to the locations of the protrusions 12 of the first mold 10. Since the protrusions 12 and the protrusions 22 have the above-mentioned positional relationship, the tip 22a of each protrusion 22 faces the bottom portion 52a. Specifically, each protrusion 22 faces a location where the corresponding protrusion 12 has come into contact with the surface 50a of the metallic material 50. Accordingly, as shown in FIG. 10, the shapes of the projecting portions 56 which are respectively formed on the right and left side surfaces 52b are more similar to each other. In other words, the shapes of the projecting portions 56 formed at the periphery of the side surfaces 52b of the recess 52 are approximately uniform. To put it another way, in FIG. 10, the non-uniformity of the undercut shape 54 in which, for example, the projecting portion 56 on the left side of the recess 52 is large and the projecting portion 56 on the right side thereof is small, can be suppressed. Consequently, the undercut shape 54 which contributes to an improvement in the bonding strength between the metallic material 50 and the resin is formed.

Furthermore, each of the plurality of protrusions 22 faces a location where a corresponding one of the plurality of protrusions 12 has come into contact with the surface 50a of the metallic material 50. Each of the plurality of protrusions 22 forms the undercut shape 54 in each of the plurality of recesses 52 formed by the respective protrusions 12 as described above. Accordingly, the undercut shapes 54, which are more similar to each other, are formed in the respective recesses 52. Thus, the substantially uniform undercut shapes 54 (which are approximately uniform) are formed in the respective recesses 52. Thus, the bonding strength between the metallic material 50 and a resin is further improved. In other words, an undercut of an appropriate shape can be more reliably formed by a simple method such as a press work.

(Second Exemplary Embodiment)

Next, a second exemplary embodiment will be described. In the second exemplary embodiment, the surface roughening method according to the first exemplary embodiment described above is applied to the formation of a pin-shaped fin (hereinafter referred to as a "pin fin") which is formed in a cooler used for cooling electronic components and the like. Specifically, in the second exemplary embodiment, surface roughening of a metallic material is performed during the formation of a cooler made of a metallic material.

FIG. 11 is a diagram showing a method for producing an electronic device 70 according to the second exemplary embodiment. The electronic device 70 includes a plurality of electronic component structures 72. The electronic device 70 has a structure in which the plurality of electronic component structures 72 are joined together in a stacked state. Each electronic component structure 72 includes an electronic component 74, such as a power card, and a cooler 150. Each electronic component structure 72 has a structure in which the electronic component 74 and the cooler 150 are molded with a resin. The cooler 150 includes a plurality of pin fins 164 which are formed in a pin-fin forming area 162.

In step A, the parts of the electronic component structure 72 are assembled. Specifically, the electronic component 74 is sandwiched between two heat conduction films 76. The electronic component 74 sandwiched between the two heat conduction films 76 is further sandwiched between two coolers 150. In other words, the heat conduction films 76 are respectively formed on the upper and lower surfaces of the electronic component 74, and the coolers 150 are formed on the upper and lower surfaces of the heat conduction films 76.

Next, in step B, a resin portion 80 is joined to the periphery of the electronic component 74 and the cooler 150, which are stacked one above the other, thereby forming the electronic component structure 72. Specifically, the periphery of the electronic component 74 and the cooler 150, which are stacked one above the other, is molded with a resin. Accordingly, the periphery of the cooler 150 is joined to the resin portion 80. Next, in step C, the plurality of electronic component structures 72 are stacked one on top of the other, to thereby form the electronic device 70. At this time, the plurality of electronic component structures 72 are joined together in a stacked state. Thus, the electronic device 70 having a structure in which the plurality of electronic component structures 72 are integrated (assembled) with each other is produced.

Figure 12:
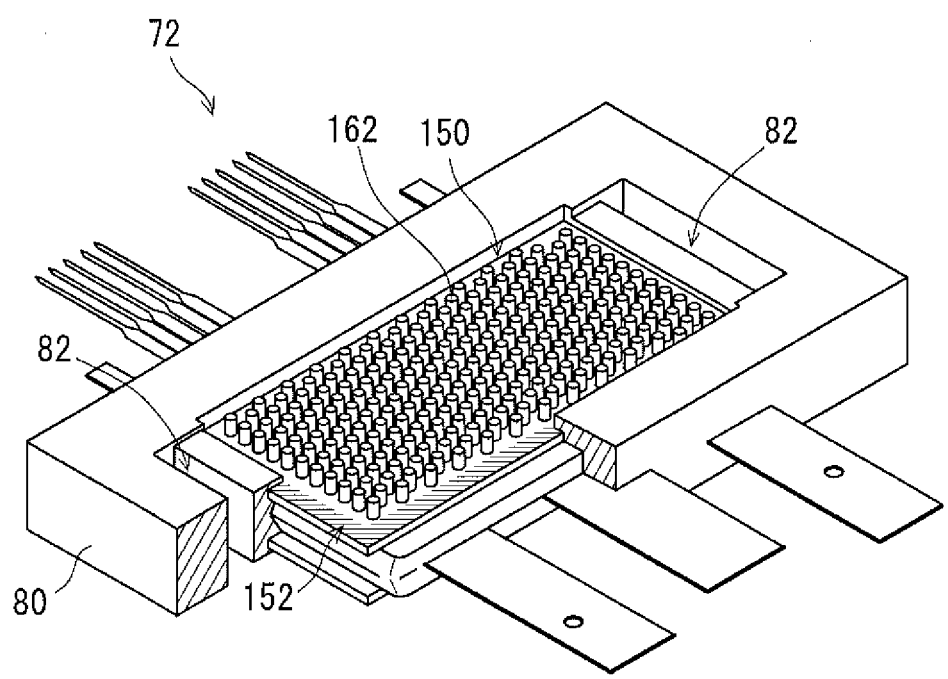
FIG. 12 is a diagram showing details of an electronic component structure according to the second exemplary embodiment.

FIG. 12 is a diagram showing details of the electronic component structure 72 according to the second exemplary embodiment. FIG. 12 shows a partially cutout view of the electronic component structure 72 in which a part of the resin portion 80 is cut out. The electronic component structure 72 is provided with two channel holes 82. A cooling water is supplied to the cooler 150 of the electronic component structure 72 through one of the channel holes 82, and the cooling water is discharged from the other one of the channel holes 82. Heat generated by the load of the electronic component 74 is transferred to the cooler 150. The cooling water flows between the pin fins 164 of the cooler 150, which allows heat exchange in the cooler 150. Thus, the electronic component 74 is cooled.

A roughened area 152 for improving the bonding strength is formed at a location where the cooler 150 is joined to the resin portion 80 at the periphery of the pin-fin forming area 162 of the cooler 150. The roughened area 152 is roughened by the surface roughening method according to the first exemplary embodiment. Specifically, the recesses 52 each having the undercut shape 54 are formed in the roughened area 152.

Figure 13:
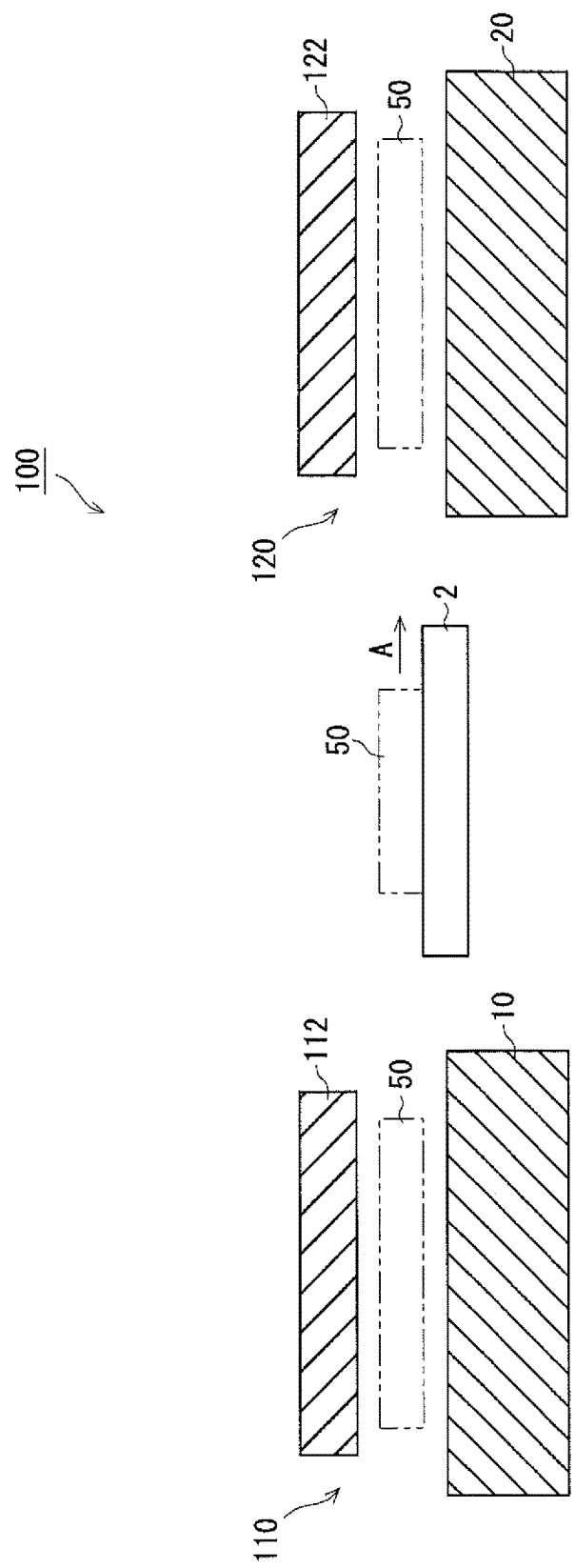
FIG. 13 is a diagram showing a cooler production apparatus for producing a cooler according to the second exemplary embodiment.

FIG. 13 is a diagram showing a cooler production apparatus 100 that produces the cooler 150 according to the second exemplary embodiment. The cooler production apparatus 100 includes the transport member 2, which transports the metallic material 50, a first molding portion 110, and a second molding portion 120. In the cooler production apparatus 100, the metallic material 50 is formed into the cooler 150 by the first molding portion 110 and the second molding portion 120. The transport member 2 transports the metallic material 50 from the first molding portion 110 to the second molding portion 120. The first molding portion 110 includes the first mold 10 according to the first exemplary embodiment and a first punch 112. The first punch 112 is preferably located above the first mold 10. The metallic material 50 is transported between the first mold 10 and the first punch 112 by the transport member 2. As described later, the first molding portion 110 forms the plurality of pin fins 164 in an area corresponding to the pin-fin forming area 162 of the metallic material 50. Further, the first molding portion 110 forms the recesses 52 in an area corresponding to the roughened area 152 of the metallic material 50.

The second molding portion 120 includes the second mold 20 according to the first exemplary embodiment and a second punch 122. The second punch 122 is preferably located above the second mold 20. The metallic material 50 is transported between the second mold 20 and the second punch 122 by the transport member 2. As described later, the second molding portion 120 cuts (trims) the outer peripheral portion of the metallic material 50 so as to correspond to the shape of the cooler 150 as a product. Further, the second molding portion 120 forms the undercut shape 54 in each of the recesses 52 which are formed in an area corresponding to the roughened area 152 of the metallic material 50. In this manner, the cooler production apparatus 100 produces the cooler 150 having the roughened area 152 from the metallic material 50.

Figure 14:
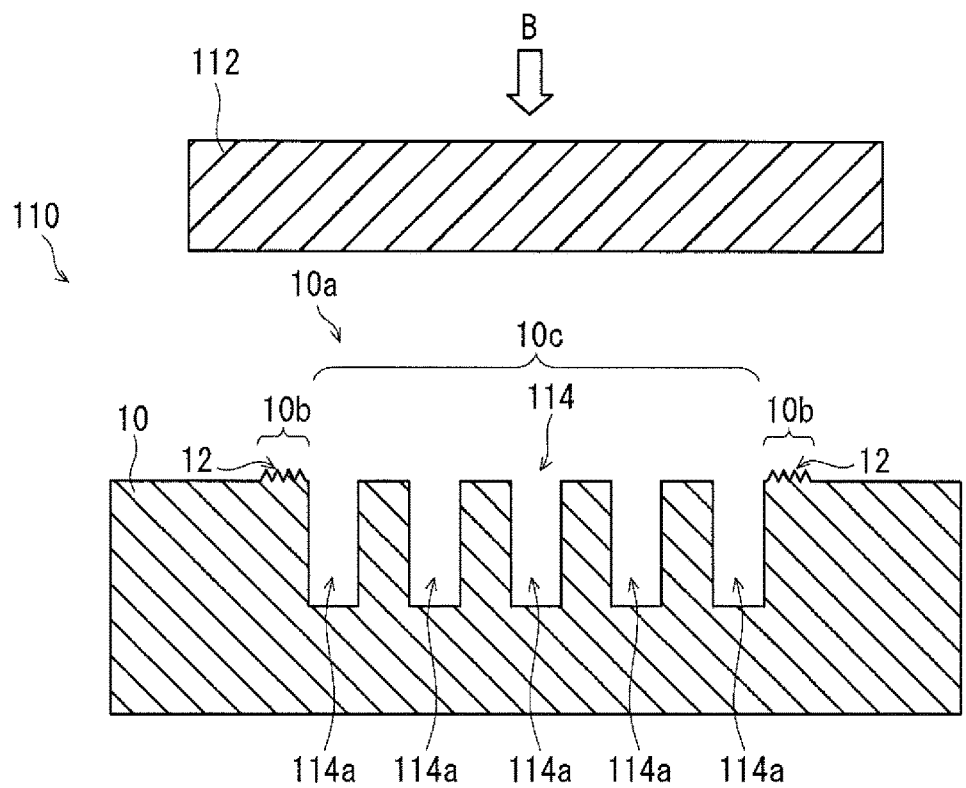
FIG. 14 is a diagram showing a first molding (forming) portion according to the second exemplary embodiment.

FIG. 14 is a diagram showing the first molding portion 110 according to the second exemplary embodiment. FIG. 14 shows a sectional view of the first molding portion 110. As indicated by the arrow B, the first punch 112 is structured to move toward the first mold 10. The first punch 112 moves in the direction indicated by the arrow B, thereby allowing the first punch 112 to press the metallic material 50, which is inserted between the first punch 112 and the first mold 10, against the first mold 10. This allows the first mold 10 to press the metallic material 50.

In the first molding portion 110, the first mold 10 is turned upside down from the state shown in FIG. 1. That is, the opposed surface 10a of the first mold 10 faces upward. As in the first exemplary embodiment, the roughening molding portion 10b is formed at the periphery of the non-roughening portion 10c of the first mold 10. Further, the protrusions 12 are formed on the roughening molding portion 10b as in the first exemplary embodiment. As described later, the first punch 112 presses the metallic material 50 against the first mold 10, thereby forming the recesses 52 in the metallic material 50.

In the second exemplary embodiment, a pin-fin forming portion 114 for forming the pin fins 164 is formed at the non-roughening portion 10c. The pin-fin forming portion 114 includes a plurality of pin fin forming recesses 114a. The shape of each of the pin fin forming recesses 114a corresponds to the shape of each pin fin 164. As described later, when the first punch 112 presses the metallic material 50 against the first mold 10, a part of the metallic material 50 is pressed into the pin fin forming recesses 114a. As a result, the pin fins 164 are formed (extrusion molding). Specifically, the first molding portion 110 forms the recesses 52 and the pin fin 164 in the metallic material 50 by a press work.

Figure 15:
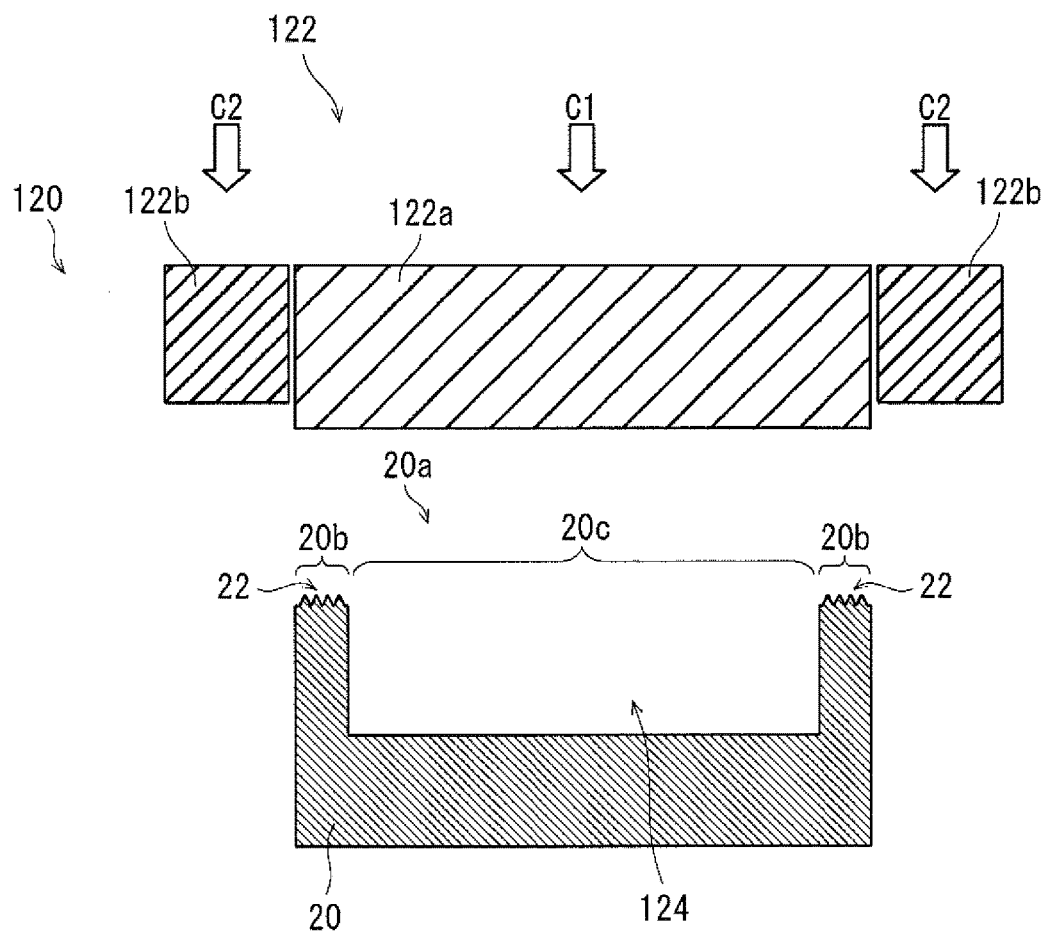
FIG. 15 is a diagram showing a second molding (forming) portion according to the second exemplary embodiment.

FIG. 15 is a diagram showing the second molding portion 120 according to the second exemplary embodiment. FIG. 15 shows a sectional view of the second molding portion 120. The second punch 122 includes a pressing member 122a and a cutting member 122b which is, for example, a cutter. The cutting member 122b is provided at the periphery of the pressing member 122a. The pressing member 122a of the second punch 122 is structured to move toward the second mold 20 as indicated by an arrow C1. When the pressing member 122a moves in the direction indicated by the arrow C1, the pressing member 122a presses the metallic material 50, which is inserted between the second punch 122 and the second mold 20, against the second mold 20. Thus, the second mold 20 presses the metallic material 50.

In the second molding portion 120, the second mold 20 is turned upside down from the state shown in FIG. 1. That is, the opposed surface 20a of the second mold 20 faces upward.

As in the first exemplary embodiment, the roughening molding portion 20b is formed at the periphery of the non-roughening portion 20c of the second mold 20. Further, the protrusions 22 are formed on the roughening molding portion 20b as in the first exemplary embodiment. As described later, the pressing member 122a presses the metallic material 50 against the second mold 20, thereby forming the undercut shape 54 in each of the recesses 52 formed in the metallic material 50.

In the second exemplary embodiment, a pin fin accommodating portion 124 is thrilled in the non-roughening portion 20c. When the metallic material 50 is inserted between the second punch 122 and the second mold 20, the pin fin accommodating portion 124 accommodates the pin fins 164 formed by the first molding portion 110. The cutting member 122b moves in a direction indicated by an arrow C2, thereby cutting (trimming) an outer peripheral portion of the metallic material 50 so that the shape of the metallic material 50 corresponds to the shape of the product of the cooler 150. That is, the second molding portion 120 forms the undercut shape 54 in each of the recesses 52 and trims the metallic material 50 by a press work.

Next, the operation of the cooler production apparatus 100 according to the second exemplary embodiment will be described.

Figure 16:
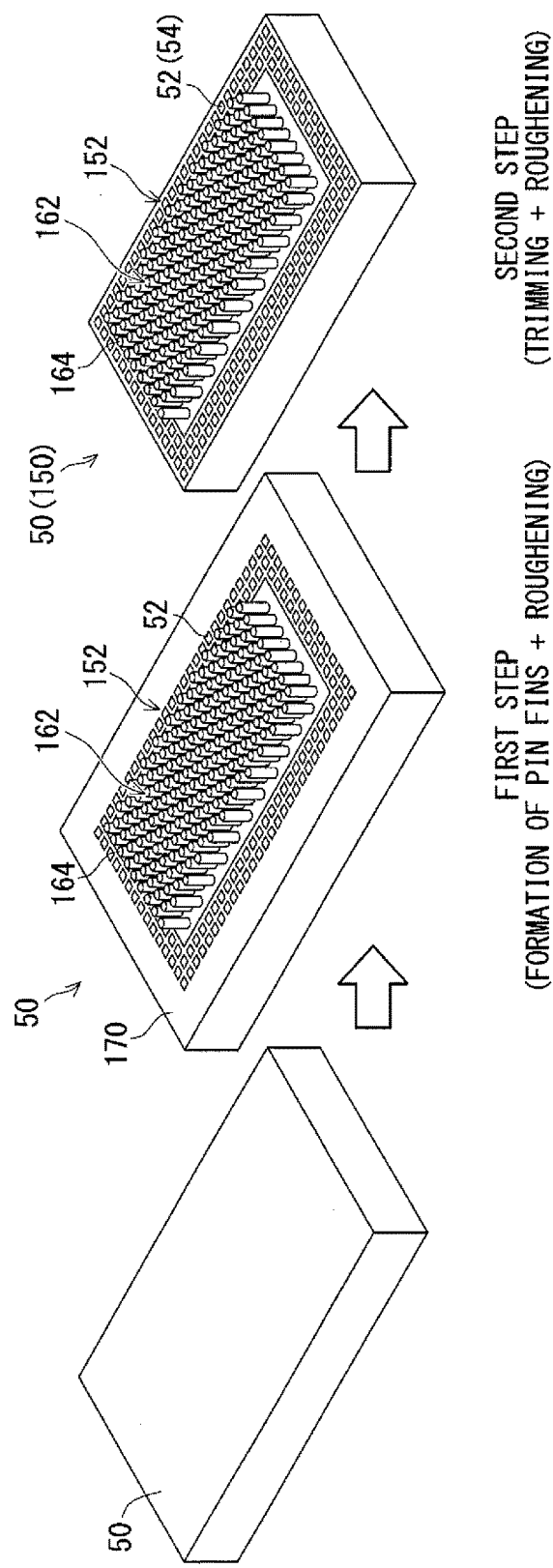
FIG. 16 is a process chart showing a method for producing a cooler by the cooler production apparatus according to the second exemplary embodiment.

FIG. 16 is a process chart showing a method for producing the cooler 150 by the cooler production apparatus 100 according to the second exemplary embodiment. In a first step, the cooler production apparatus 100 forms the plurality of pin fins 164 in a location corresponding to the pin-fin forming area 162 of the metallic material 50. Further, in the first step, the cooler production apparatus 100 forms the plurality of recesses 52 in the roughened area 152 around the pin-fin forming area 162 of the metallic material 50. The formation of the plurality of recesses 52 corresponds to the formation of the recesses 52 shown in FIG. 8. That is, in the first step shown in FIG. 16, the pin fins 164 are formed and the recesses 52 are formed as shown in FIG. 8.

Next, in a second step, the cooler production apparatus 100 cuts (trims) an outer peripheral portion 170 of the metallic material 50. Further, in the second step, the cooler production apparatus 100 forms (imparts) the undercut shape 54 in each of the plurality of recesses 52 formed in the roughened area 152. The formation of the undercut shape 54 corresponds to the formation of the undercut shape 54 shown in FIG. 9. That is, in the second step shown in FIG. 16, the trimming of the outer peripheral portion 170 is performed and the undercut shape 54 is formed as shown in FIG. 9. Thus, the cooler production apparatus 100 produces the cooler 150 from the metallic material 50.

Figure 17:
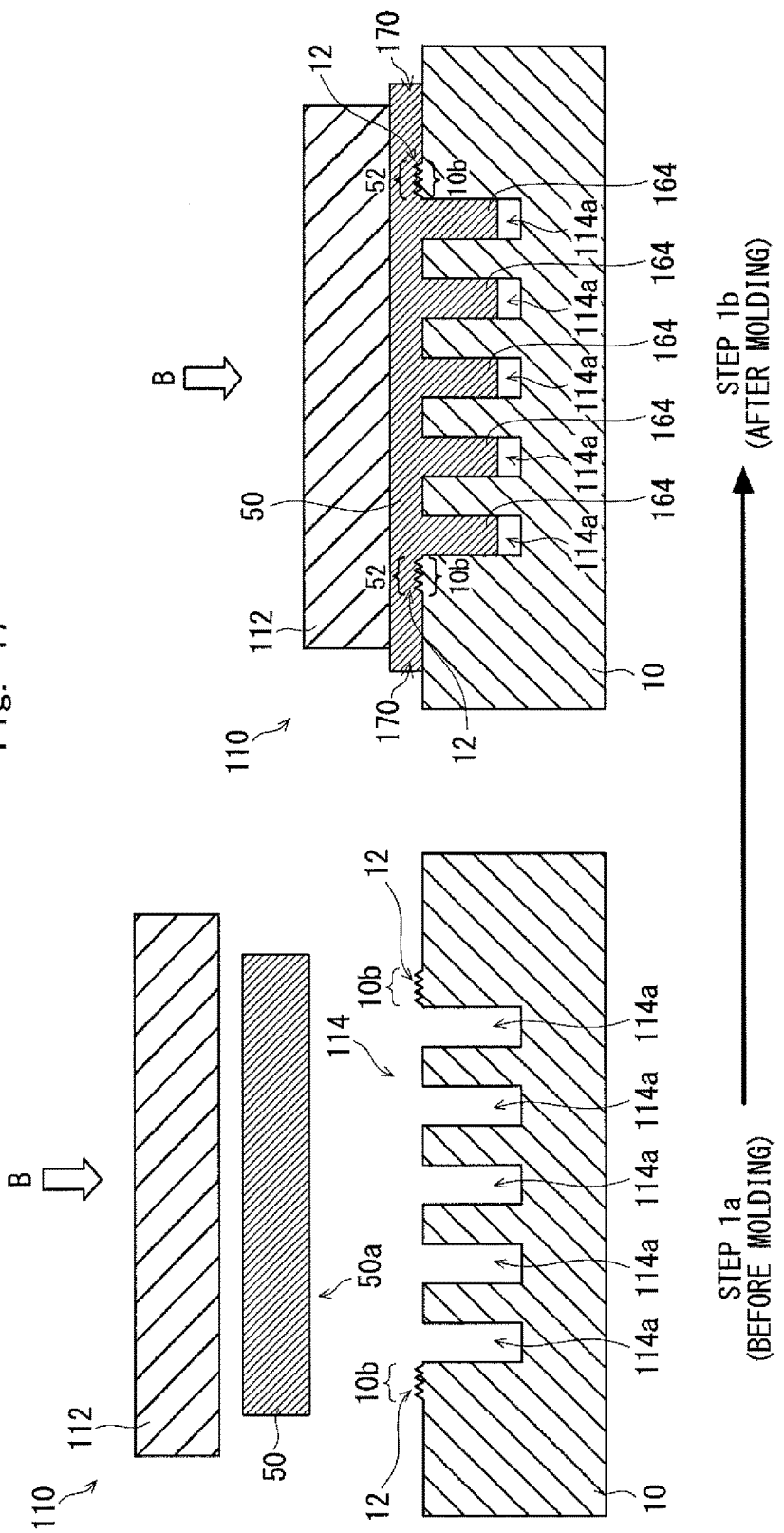
FIG. 17 is a process chart showing details of a first step shown in FIG. 16.

FIG. 17 is a process chart showing details of the first step shown in FIG. 16. First, in step 1 a, the transport member 2 transports the metallic material 50 to an area between the first mold 10 and the first punch 112 of the first molding portion 110. As a result, the surface 50a of the metallic material 50 faces the roughening molding portion 10b and the pin-fin forming portion 114. More specifically, the plurality of protrusions 12 formed on the roughening molding portion 10b face the location corresponding to the roughened area 152 of the metallic material 50. Further, the pin-fin forming portion 114 faces the location corresponding to the pin-fin forming area 162 of the metallic material 50.

Next, in step 1b, the first punch 112 is moved toward the metallic material 50 as indicated by the arrow B, the first punch 112 presses the metallic material 50 against the first mold 10. Accordingly, a part of the surface 50a of the metallic material 50 is pressed into the pin fin forming recesses 114a. Thus, the pin fins 164 are formed in the respective pin fin forming recesses 114a. Note that the shape of each of the formed pin fins 164 corresponds to the inner shape of each of the pin fin forming recesses 114a.

At this time, the surface 50a of the metallic material 50 is pressed against the roughening molding portion 10b by the first punch 112. Accordingly, the plurality of protrusions 12 form the respective recesses 52 at the periphery of the pin-fin forming area 162 of the metallic material 50 as in the first exemplary embodiment. At this time, the first punch 112 presses the metallic material 50, which allows the outer peripheral portion 170 of the metallic material 50 to protrude outward.

In this manner, the first molding portion 110 forms the pin fins 164 and forms the recesses 52 as shown in FIG. 8. In other words, the cooler production apparatus 100 according to the second exemplary embodiment can perform the formation of the pin fins 164 and the formation of the recesses 52 for roughening in the same step (first step). Accordingly, the number of steps in the process of producing the cooler 150 can be reduced in comparison with a case where the formation of the pin fins 164 and the formation of the recesses 52 are performed in different steps. Therefore, the time for producing the cooler 150 can be shortened and the manufacturing cost thereof can be reduced in the second exemplary embodiment.

Figure 18:
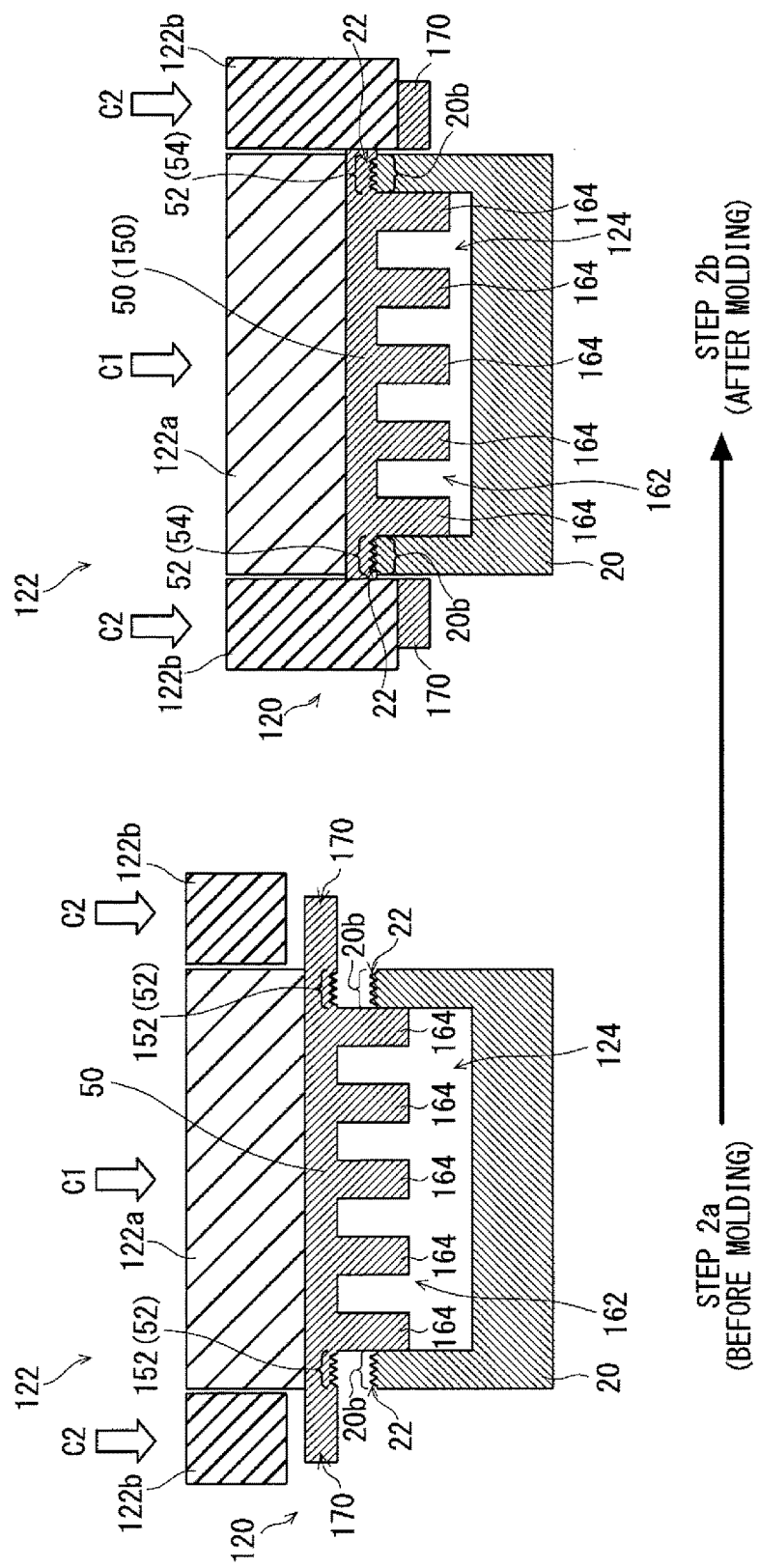
FIG. 18 is a process chart showing details of a second step shown in FIG. 16.

FIG. 18 is a process chart showing details of the second step shown in FIG. 16. First, in step 2a, the transport member 2 transports the metallic material 50 in which the pin fins 164 and the recesses 52 are formed by the first molding portion 110 to an area between the second mold 20 and the second punch 122 of the second molding portion 120. At this time, the pin fins 164 are accommodated in the pin fin accommodating portion 124 of the second mold 20. As a result, the roughened area 152 of the metallic material 50 faces the roughening molding portion 20b. More specifically, the plurality of recesses 52 formed in the roughened area 152 respectively face the plurality of protrusions 22 formed on the roughening molding portion 20b.

Next, in step 2b, the second punch 122 is moved toward the metallic material 50. Specifically, the pressing member 122a of the second punch 122 is moved toward the metallic material 50 as indicated by the arrow C1, thereby allowing the pressing member 122a to press the metallic material 50 against the second mold 20. Thus, the plurality of protrusions 22 form (impart) the undercut shape 54 in each of the recesses 52 as in the first exemplary embodiment. In this case, the outer peripheral portion 170 of the metallic material 50 protrudes from outer ends of the second mold 20.

Since the pressing member 122a presses the metallic material 50 at this time, the metallic material 50 is fixed to the second mold 20. In this state, the cutting member 122b of the second punch 122 is moved toward the metallic material 50 as indicated by the arrow C2, so that the cutting member 122b cuts the outer peripheral portion 170. Thus, the cooler 150 which conforms to the dimensions of the product is produced.

In this manner, the second molding portion 120 cuts (trims) the outer peripheral portion 170 of the metallic material 50 and forms the undercut shape 54 in each of the recesses 52 as shown in FIG. 9. In other words, the cooler production apparatus 100 according to the second exemplary embodiment can perform the trimming of the metallic material 50 and imparting of the undercut shape 54 to each recess 52 in the same step (second step). Accordingly, the number of steps in the process of producing the cooler 150 can be reduced in comparison with a case where the trimming of the metallic material 50 and the formation of the undercut shape 54 are performed in different steps. Therefore, the time for producing the cooler 150 can be shortened and the manufacturing cost thereof can be reduced in the second exemplary embodiment.

The roughened area 152 is located at a position separated from the pin-fin forming area 162. Accordingly, effects on the formation of the pin fins 164 can be suppressed even when roughening and formation of the pin fins 164 are performed in the same step as in the second exemplary embodiment.

(Modified Example)

Note that the disclosure is not limited to the exemplary embodiments described above, which can be modified as described below. For example, in the second exemplary embodiment described above, the formation the pin fins 164 and trimming are carried out in the same step as the roughening step. However, the formation of the pin fins 164 and trimming may be carried out in a step different from the roughening step.

FIG. 19 is a process chart showing an example in which the formation of the pin fins 164 and trimming are carried out in a step different from the roughening step. First, in step S102, the plurality of pin fins 164 are formed in the location corresponding to the pin-fin forming area 162 of the metallic material 50. This step S102 can be performed using the first molding portion 110 shown in FIG. 14 from which the roughening molding portion 10b (protrusions 12) is omitted. Next, in step S104, the outer peripheral portion 170 of the metallic material 50 is cut (trimmed). This step S104 can be performed using the second molding portion 120 shown in FIG. 15 from which the roughening molding portion 20b (protrusions 22) is omitted.

Next, in step S106, the plurality of recesses 52 are formed in the roughened area 152 around the pin-fin forming area 162 of the metallic material 50. This step S106 corresponds to S12 (first step) shown in FIG. 7. This step S106 can be performed using the first molding portion 110 shown in FIG. 14 in which the pin-fin forming portion 114 is replaced by the pin fin accommodating portion 124 of the second mold 20 shown in FIG. 15. In other words, the step S106 can be performed using the first mold 10 shown in FIG. 2 in which a cavity that can accommodate the pin fins 164, like the pin fin accommodating portion 124, is formed on the non-roughening portion 10c.

Next, in step S108, the undercut shape 54 is formed in (imparted to) each of the plurality of recesses 52 formed in the roughened area 152 around the pin-fin forming area 162 of the metallic material 50. This step S108 corresponds to S16 (second step) shown in FIG. 7. This step S108 can be performed using the second molding portion 120 shown in FIG. 15 from which the cutting member 122b is omitted. In other words, the step S108 can be performed using the second mold 20 shown in FIG. 4 in which a cavity that can accommodate the pin fins 164, like the pin fin accommodating portion 12, is formed on the non-roughening portion 20c.

In this case, in the second exemplary embodiment, the metallic material 50 is disposed between the first mold 10 and the first punch 112, and the first punch 112 presses the metallic material 50 against the first mold 10. On the other hand, in the example of FIG. 19, only the first mold 10 may be used without using the first punch 112. Specifically, the first mold 10 in which a cavity that can accommodate the pin fins 164 in the non-roughening portion 10c may be disposed above the metallic material 50 and the first mold 10 may be moved downward as shown in FIG. 8 and the like, to thereby allow the first mold 10 to press the metallic material 50 from above. The same is true of the second mold 20.

In the first molding portion 110 according to the second exemplary embodiment described above, the first punch 112 is located above the first mold 10, but the location of the first punch 112 is not limited to this. The first punch 112 may be located below the first mold 10. In this case, the first punch 112 may press the metallic material 50 from below. The same is true of the second molding portion 120. Also in the first exemplary embodiment, the first mold 10 may press the metallic material 50 from below. The same is true of the second mold 20.

In the second exemplary embodiment described above, roughening is performed in both of the step of forming the pin fins 164 and the trimming step. However, roughening may be performed in one of the step of forming the pin fins 164 and the trimming step. In this case, the first step (S12) of roughening may be performed in the trimming step, without performing roughening in the step of fanning the pin fins 164. In this case, the second step (S16) of roughening is carried out alone. Alternatively, the first step (S12) of roughening may be performed in the step of forming the pin fins 164, without performing roughening in the trimming step. More alternatively, the first step of roughening may be carried out first and the second step of roughening may be carried out in the step of forming the pin fins 164, or in the trimming step.

In the first exemplary embodiment described above, the transport member 2 transports the metallic material 50. However, the transport member 2 may be omitted. That is, there is no need to form the first mold 10 and the second mold 20 separately, and thus there is no need to move the metallic material 50. In this case, the first mold 10 may be replaced by the second mold 20 after the first mold 10 forms the recesses 52 by pressing the metallic material 50. However, the use of the transport member 2 eliminates the need to replace the first mold 10 by the second mold 20. The same is true of the second exemplary embodiment.

In the exemplary embodiments described above, the pitch P1 of the protrusions 12 is substantially the same as the pitch P2 of the protrusions 22, but the structure is not limited to this structure. However, when the pitch P1 of the protrusions 12 is substantially the same as the pitch P2 of the protrusions 22, the recesses 52 each having the undercut shape 54 can be formed at substantially regular intervals. This leads to an improvement in the bonding strength between the metallic material 50 and the resin.

Each protrusion need not have a pointed tip, as long as the undercut shape 54 can be appropriately formed. That is, the term "the angle at the tip (tip angle) of each protrusion" refers to a degree of extension of the side surface of each protrusion. More specifically, the term "the tip angle of each protrusion" refers to (twice) the slope of the side surface of each protrusion, which comes into contact with the metallic material 50, in the direction toward the metallic material 50. Even when the slope $\theta 2$ of the side surface 22b of each protrusion 22 is greater than the slope $\theta 1$ of the side surface 12b of each protrusion 12 and the tip 22a of each protrusion 22 is sharper than the tip 12a of each protrusion 12 (for example, when only the tip 22a is formed in a needle-like shape), it can be said that the "tip angle" of each protrusion 12 is smaller than the "tip angle" of each protrusion 22.

The pitch of the protrusions 12, the pitch of the protrusions 22, the length of each of the protrusions 12 and the protrusions 22 (i.e., the depth of each recess 52 and the location of the undercut shape 54), and the tip angle of each of the protrusions 12 and the protrusions 22 can be changed as needed depending on the material to be joined, necessary bonding strength, and the like. That is, in the exemplary embodiments, it is only necessary to change the above-described parameters so as to satisfy the bonding strength necessary for various materials.

For example, if a high bonding strength is required, the depth of each recess 52 may be increased, or the pitch of the recesses 52 may be narrowed. In the case of producing the cooler 150 as in the second exemplary embodiment, the pitch of the recesses 52 is increased to form a planar portion in the area between the adjacent recesses 52, without processing the area. This leads to an improvement in sealing properties for cooling water in the roughened area 152.

Figure 20:
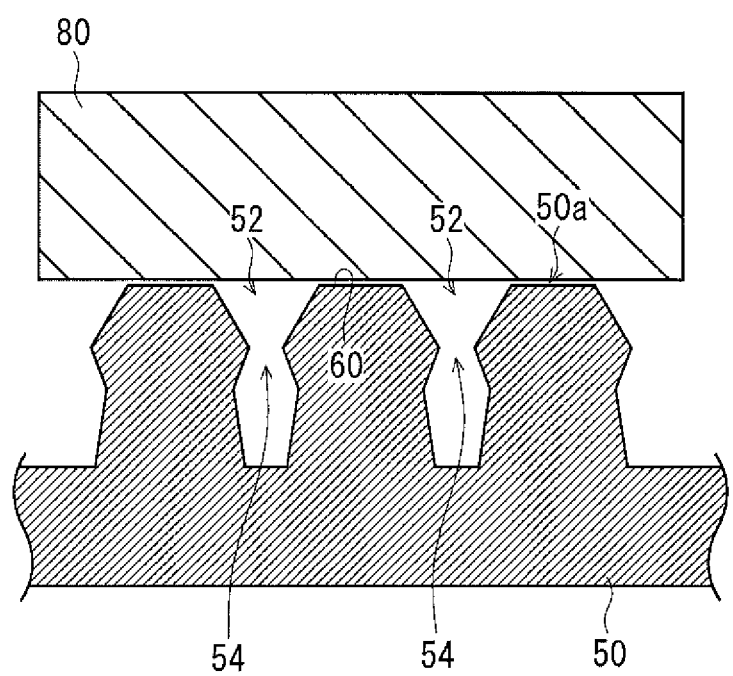
FIG. 20 is a diagram showing a state in which a planar portion is provided between adjacent recesses.

FIG. 20 is a diagram showing a state in which a planar portion is formed between the adjacent recesses 52. By increasing the pitch of the protrusions 12 and the pitch of the protrusions 22, a planar portion 60 is formed between the adjacent recesses 52 as shown in FIG. 20. In this case, when the cooler 150 is molded with a resin, the resin portion 80 is brought into surface contact with the planar portion 60 on the surface 50a of the metallic material 50. Thus, the resin portion 80 is brought into surface contact with the planar portion 60, thereby preventing leakage of cooling water to the outside through the roughened area 152. In other words, the sealing properties for cooling water in the roughened area 152 are improved.

The second exemplary embodiment described above illustrates an example in which the surface roughening method according to the first exemplary embodiment is applied to the production of the cooler 150. The surface roughening method according to the first exemplary embodiment can be applied not only to the production of the cooler, but also to processing steps for any product to be joined with a resin. In this case, the non-roughening portion 10c of the first mold 10 and the non-roughening portion 20c of the second mold 20 may be formed into any shape depending on the shape of the product.

What is claimed is:

1. A surface roughening apparatus that roughens a surface of a metal stock, the surface roughening apparatus comprising:
    a first mold having a plurality of first protrusions, a surface of the first mold having the plurality of first protrusions formed thereon being configured to press the metal stock in a state where the surface of the first mold faces a first surface of the metal stock, thereby forming recesses in the metal stock each having a shape corresponding to a shape of each of the first protrusions; and
    a second mold having a plurality of second protrusions, a surface of the second mold having the plurality of second protrusions formed thereon being configured to face the first surface of the metal stock after the formation of the recesses in the metal stock by the first mold, the plurality of second protrusions being configured to press the metal stock in a state where the plurality of second protrusions are respectively pressed into the recesses, thereby deforming the recesses formed in the metal stock into an undercut shape, wherein
    a height of each of the first protrusions is greater than a height of each of the second protrusions, and
    a tip angle of each of the first protrusions is smaller than a tip angle of each of the second protrusions.

2. The surface roughening apparatus according to claim 1, wherein the surface of the second mold having the plurality of second protrusions formed thereon is configured so that when the second mold presses the metal stock, each of the plurality of second protrusions faces a location where a corresponding one of the plurality of first protrusions has come into contact with the metal stock.

3. The surface roughening apparatus according to claim 1, wherein
    the surface of the first mold having the plurality of first protrusions formed thereon includes a non-roughening area in which the plurality of first protrusions are not formed, and
    the surface of the second mold having the plurality of second protrusions formed thereon includes a non-roughening area in which the plurality of second protrusions are not formed.

4. The surface roughening apparatus according to claim 1, wherein a pitch of the first protrusions is substantially equal to a pitch of the second protrusions.

5. A surface roughening method that roughens a surface of a metal stock, the surface roughening method comprising:
    a first step of forming recesses in the metal stock with a first mold having a plurality of first protrusions, each of the recesses having a shape corresponding to a shape of a corresponding one of the first protrusions, by pressing a surface of the first mold having the plurality of first protrusions formed thereon against the metal stock in a state where the surface of the first mold faces a first surface of the metal stock; and
    a second step of deforming the recesses formed in the metal stock into an undercut shaped with a second mold having a plurality of second protrusions by pressing a surface of the second mold having the plurality of second protrusions formed thereon and facing the first surface of the metal stock against the first surface of the metal stock after the first step so that the metal stock is pressed in a state in which the plurality of second protrusions are respectively pressed into the recesses, the plurality of second protrusions having a height lower than a height of each of the first protrusions, and having a tip angle larger than a tip angle of each of the first protrusions.

6. The method according to claim 5, wherein when the second mold presses the metal stock, each of the plurality of second protrusions faces a location where a corresponding one of the plurality of first protrusions has come into contact with the metal stock.

7. The method according to claim 5, wherein
    the surface of the first mold having the plurality of first protrusions formed thereon includes a non-roughening area in which the plurality of first protrusions are not formed,
    the surface of the second mold having the plurality of second protrusions formed thereon includes a non-roughening area in which the plurality of second protrusions are not formed, and
    a portion of the first surface of the metal stock corresponding to the non-roughening areas of the first and second molds, does not have the recesses with the undercut shape.

8. The method according to claim 5, wherein a pitch of the first protrusions is substantially equal to a pitch of the second protrusions.

* * * * *